(12) United States Patent
Sakaguchi

(10) Patent No.: US 7,867,894 B2
(45) Date of Patent: Jan. 11, 2011

(54) METHOD FOR PRODUCING SUBSTRATE

(75) Inventor: Hideaki Sakaguchi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 263 days.

(21) Appl. No.: 12/257,697

(22) Filed: Oct. 24, 2008

(65) Prior Publication Data
US 2009/0117738 A1 May 7, 2009

(30) Foreign Application Priority Data
Oct. 25, 2007 (JP) .............................. 2007-277438

(51) Int. Cl.
*H01L 21/302* (2006.01)
(52) U.S. Cl. ................ 438/639; 438/667; 438/695; 438/702; 257/E21.597; 257/E23.011
(58) Field of Classification Search ................ 438/639, 438/694, 695, 700, 702, 719; 257/E21.597, 257/E23.011
See application file for complete search history.

(56) References Cited
U.S. PATENT DOCUMENTS
6,790,775 B2 * 9/2004 Fartash ........................ 438/667

| | | | |
|---|---|---|---|
| 7,022,609 B2 * | 4/2006 | Yamamoto et al. ............ | 438/694 |
| 2006/0108666 A1 * | 5/2006 | Koizumi ........................ | 257/621 |
| 2007/0246819 A1 * | 10/2007 | Hembree et al. .............. | 257/698 |
| 2008/0042247 A1 * | 2/2008 | Wood et al. ................... | 257/669 |
| 2009/0047781 A1 * | 2/2009 | Pratt et al. .................... | 438/667 |

FOREIGN PATENT DOCUMENTS
JP    2004-095849    3/2004

* cited by examiner

*Primary Examiner*—Fernando L Toledo
(74) *Attorney, Agent, or Firm*—Drinker Biddle & Reath LLP

(57) ABSTRACT

A metallic film 43 that becomes the matrix of pad 32 is formed on semiconductor substrate 41. Next, through hole 31 is formed in the semiconductor substrate 41 facing the metallic film 43 at the portion corresponding to an area where the pad 32 is formed. Thereafter, penetration electrode 17 is formed in through hole 31. Next, penetration portion 49 to expose the side of the penetration electrode 17 is formed in the semiconductor substrate 41. Next, an insulative member 16 is formed to be filled up in at least the penetration portion 49. After that, the pad 32 is formed by patterning the metallic film 43.

7 Claims, 43 Drawing Sheets

METHOD FOR PRODUCING SUBSTRATE

BACKGROUND OF THE INVENTION

The present invention relates to a method for producing a substrate including a pad formed at one side of a semiconductor substrate and simultaneously insulated from the semiconductor substrate and a penetration electrode formed in the semiconductor substrate at the portion facing the pad, one end part of which is connected to the pad, and simultaneously insulated from the semiconductor substrate.

As prior art substrates, there is a substrate equipped with a semiconductor device (for example, CMOS sensor and memory, etc.) formed on a semiconductor substrate, a pad formed at one side of the semiconductor substrate and electrically connected to the semiconductor device, and a penetration electrode that penetrates the semiconductor substrate at the portion facing the pad, one end part of which is electrically connected to the pad, and a substrate (See FIG. 1) equipped with a pad formed on one side of the semiconductor substrate and electrically connected to a semiconductor chip, and a penetration electrode penetrating the semiconductor substrate at the portion facing the pad, one end part of which is connected to the pad.

FIG. 1 is a sectional view of a prior art substrate.

Referring to FIG. 1, the prior art substrate 200 includes a semiconductor substrate 201, oxidation films 202, 203, a penetration electrode 204, and a pad 205. The semiconductor substrate 201 is a plate-shaped substrate, and a through hole 207 is formed. As the semiconductor substrate 201, for example, a silicon substrate may be used.

The oxidation film 202 is provided so as to cover the surface 201A of the semiconductor substrate 201 and the rear 201B thereof. The oxidation film 203 is provided so as to cover the side of the semiconductor substrate 201 at the portion corresponding to the side of the through hole 207.

The penetration electrode 204 is provided in the through hole 207 having the oxidation film 203 formed thereon. The pad 205 is provided on the upper end part of the penetration electrode 204 and on the oxidation film 202 formed on the surface 201A of the semiconductor substrate 201. The pad 205 is electrically connected to the penetration electrode 204. The pad 205 is a pad electrically connected to a semiconductor chip (not illustrated).

FIGS. 2 to 8 are views showing production processes of a prior art substrate. In FIGS. 2 to 8, components that are identical to those of the prior art substrate 200 are given the same symbols.

Referring to FIGS. 2 to 8, a description is given of a method for producing a prior art substrate. First, in the process shown in FIG. 2, oxidation films 202 are formed so as to cover both sides 201A and 201B of a semiconductor substrate 201. Next, in the process shown in FIG. 3, an opening portion 202A is formed in the oxidation film 202 provided at the rear 201B of the semiconductor substrate 201. The opening portion 202A is formed so as to expose the rear 201B of the semiconductor substrate 201 at the portion corresponding to an area where the through hole 207 is formed.

Next, in the process shown in FIG. 4, a through hole 207 that penetrates the semiconductor substrate 201 is formed by etching in which the oxidation film 202 having the opening portion 202A formed therein is used as a mask. Next, in the process shown in FIG. 5, the semiconductor substrate 201 at the portion corresponding to the side of the through hole 207 is thermally oxidized, the oxidation film 203 is formed on the semiconductor substrate 201 at the portion corresponding the side of the through hole 207.

Next, in the process shown in FIG. 6, a pad 205 is formed on the oxidation film 202 at the portion positioned upward of the through hole 207. Next, in the process shown in FIG. 7, the oxidation film 202 disposed between the pad 205 and the through hole 207 is removed by etching (dry etching or wet etching).

Further, in the process shown in FIG. 8, a penetration electrode 204 is formed by filling up a conductive material in the opening portion 202A shown in FIG. 7 and the through hole 207, thereby producing a substrate 200 (For example, refer to Patent Document 1).

[Patent Document 1] JP-A-No. 2004-95849

However, in compliance with the prior art method for producing the substrate 200, the oxidation film 202 disposed between the pad 205 and the through hole 207 is removed by etching (dry etching or wet etching) after the oxidation film 203 is formed at the semiconductor substrate 201 at the portion corresponding to the side of the through hole 207. Therefore, an etching remainder (residue) occurs at the oxidation film 202 at the portion disposed between the pad 205 and the through hole 207 (in this case, the resistance value between the penetration electrode 204 and the pad 205 is increased), the oxidation film 203 for which etching is not required is etched to thin the thickness of the oxidation film 203 (in this case, defective insulation is brought about between the semiconductor substrate 201 and the penetration electrode 204). Accordingly, there is a problem that the yield of substrates 200 is lowered.

SUMMARY OF THE INVENTION

Therefore, the present invention is developed in view of the above-described problem, and it is an object of the present invention to provide a method for producing substrates, which can improve the yield thereof.

According to a first aspect of the present invention, there is provided a method for producing a substrate including a semiconductor substrate, a pad provided at one side of the semiconductor substrate and insulated from the semiconductor substrate, and a penetration electrode disposed so as to penetrate the semiconductor substrate at a portion facing the pad, one end part of which is connected to the pad and is insulated from the semiconductor substrate;

the method including the steps of:

forming a metallic film, which is a matrix of the pad, on the semiconductor substrate;

forming a through hole in the semiconductor substrate at a portion facing the metallic film at the portion corresponding to an area where the pad is formed;

forming a penetration electrode in the through hole;

forming a penetration portion, by which the side of the penetration electrode is exposed, in the semiconductor substrate;

forming an insulative material so as to fill up at the least the penetration portion; and forming the pad by patterning the metallic film after the step of forming the insulative material.

According to a second aspect of the invention, there is provided the method for producing a substrate according to the first aspect, wherein in the penetration electrode forming step, the penetration electrode is formed by an electrolytic plating method by which the metallic film is used as a power feeding layer.

According to a third aspect of the invention, there is provided the method for producing a substrate according to the first or second aspect, wherein the penetration electrodes are provided in a plurality, and in the penetration portion forming step, the penetration portion is formed so that the sides of at least two or more penetration electrodes are exposed.

According to a forth aspect of the invention, there is provided the method for producing a substrate according to any one of the first to third aspects, wherein in the insulative material forming step, the penetration portion is filled up, and the insulative material is formed so as to cover the other side of the semiconductor substrate positioned at an opposite side of the one side.

According to a fifth aspect of the invention, there is provided the method for producing a substrate according to any one of the first to forth aspects, wherein in the insulative material forming step, the insulative material is formed by a printing method.

According to a sixth aspect of the invention, there is provided the method for producing a substrate according to any one of the first to fifth aspects, wherein in the penetration electrode forming step, the penetration electrode is formed so that one end part of the penetration portion at a side not connected to the pad protrudes from the other side of the semiconductor substrate.

According to a seventh aspect of the invention, there is provided the method for producing a substrate according to any one of the first to sixth aspects, further including:

a step of forming a semiconductor device electrically connected to the pad at one side of the semiconductor substrate before the metallic film forming step.

According to the present invention, a metallic film that becomes the matrix of a pad is formed on a semiconductor substrate, a through hole is thereafter formed in the semiconductor substrate at the portion facing the metallic film at the portion corresponding to the area where the pad is formed, a penetration electrode is next formed in the through hole, a penetration portion that exposes the side of the penetration electrode is next formed in the semiconductor substrate, an insulative material is thereafter formed so that an insulative material so as to fill up at least the penetration portion, and a pad is thereafter formed by patterning the metallic film. Thereby, no insulative material intervenes between the pad and the penetration electrode (that is, the resistance value between the penetration electrode and the pad does not increase), and at the same time, it becomes possible to sufficiently secure the thickness of the insulative material disposed between the side of the penetration electrode and the semiconductor substrate (that is, the insulation property between the penetration electrode and the semiconductor substrate can be sufficiently secured). Accordingly, the yield of substrates can be improved.

According to the present invention, the yield of substrates can be improved.

DETAILED DESCRIPTION OF THE PREFERRED EMBODIMENTS

Next, a description is given of embodiments of the present invention with reference to the drawings.

Embodiment 1

Figure 1:
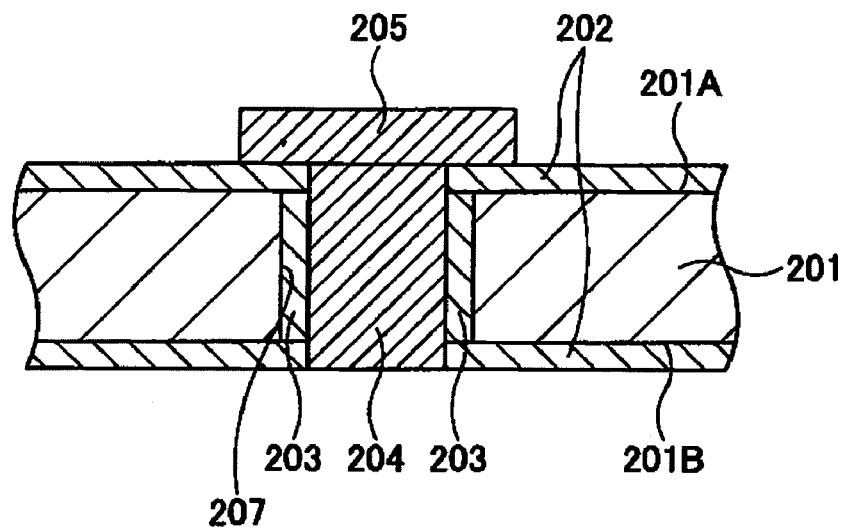
FIG. 1 is a sectional view showing a prior art substrate.
Figure 2:
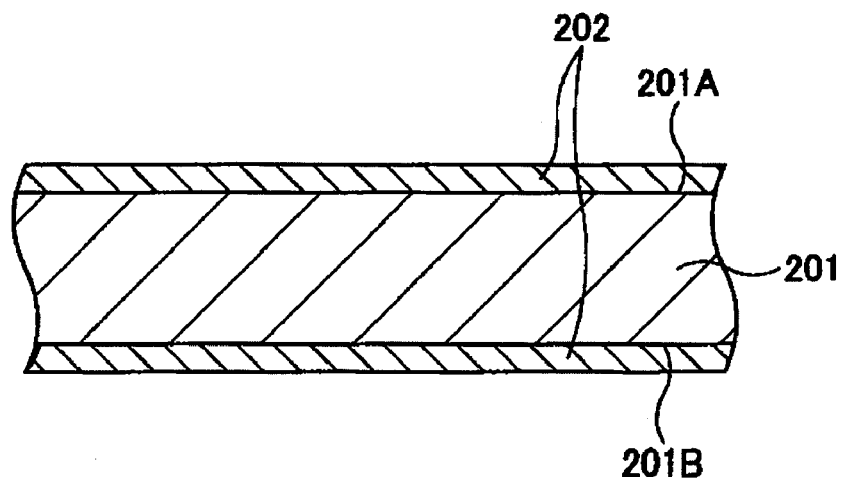
FIG. 2 is a view (Part 1) showing the process of producing the prior art substrate.
Figure 3:
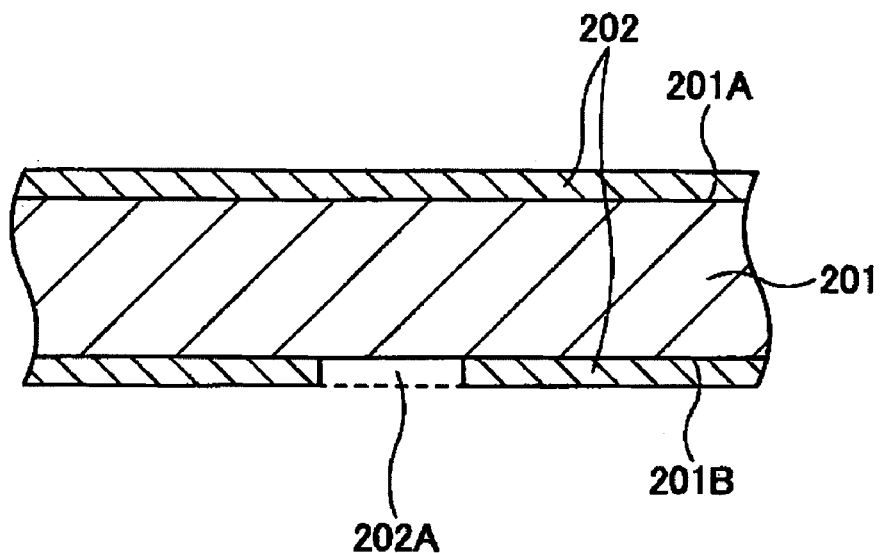
FIG. 3 is a view (Part 2) showing the process of producing the prior art substrate.
Figure 4:
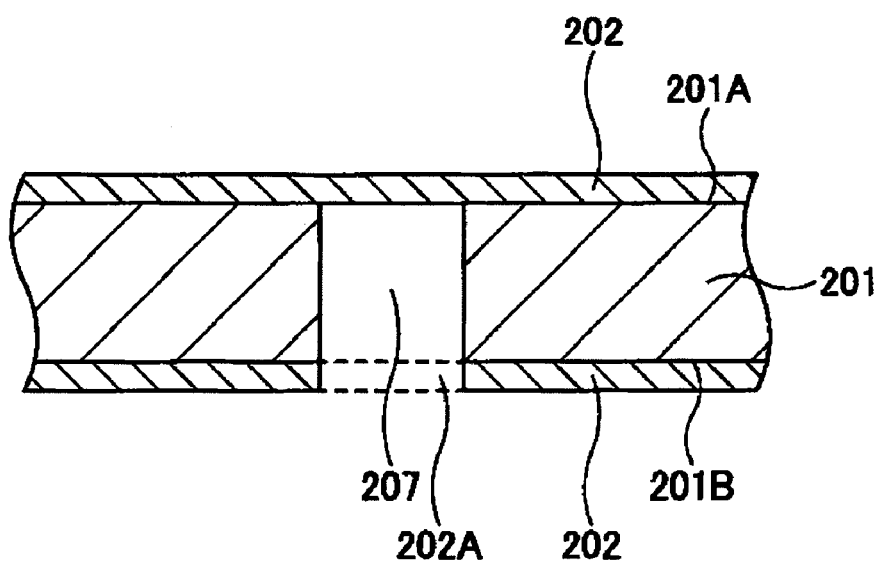
FIG. 4 is a view (Part 3) showing the process of producing the prior art substrate.
Figure 5:
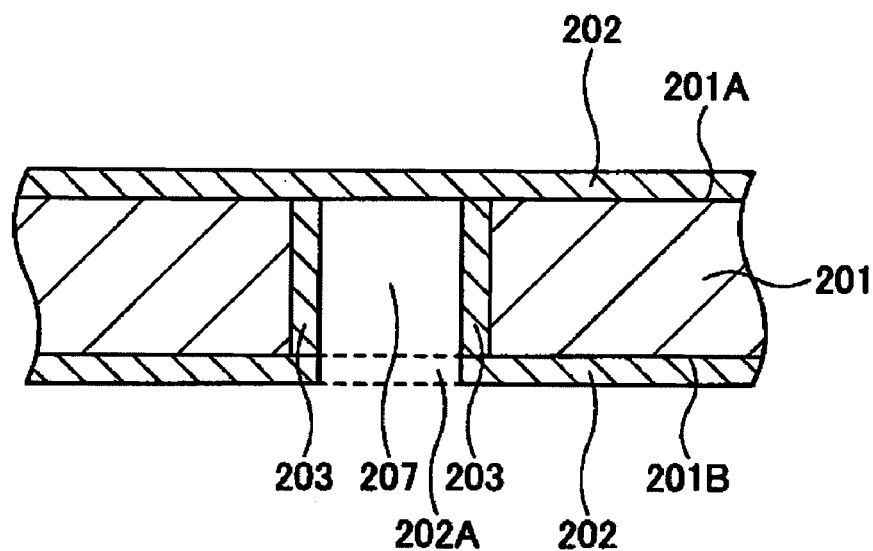
FIG. 5 is a view (Part 4) showing the process of producing the prior art substrate.
Figure 6:
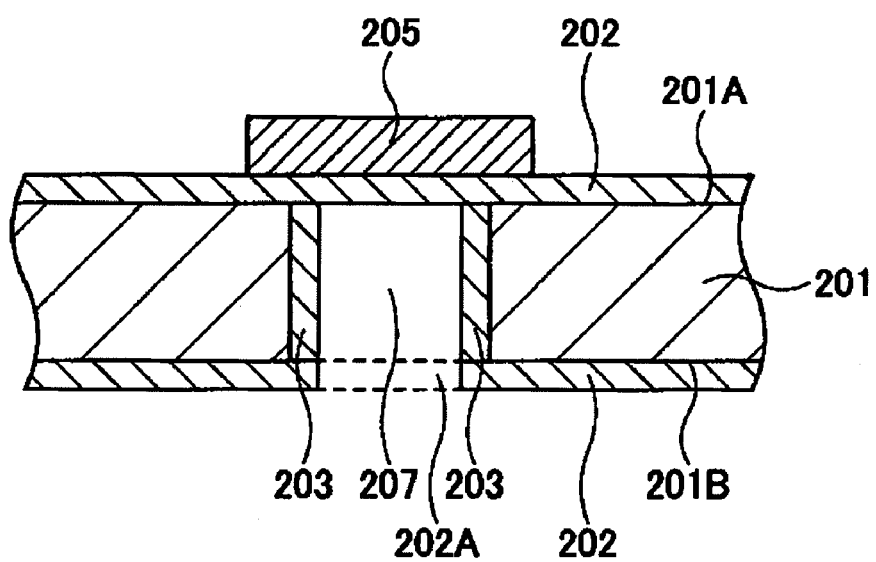
FIG. 6 is a view (Part 5) showing the process of producing the prior art substrate.
Figure 7:
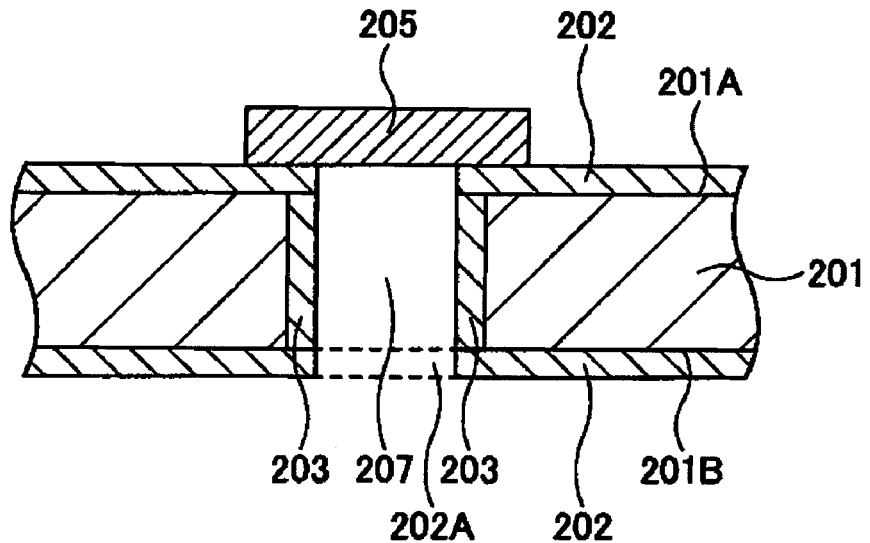
FIG. 7 is a view (Part 6) showing the process of producing the prior art substrate.
Figure 8:
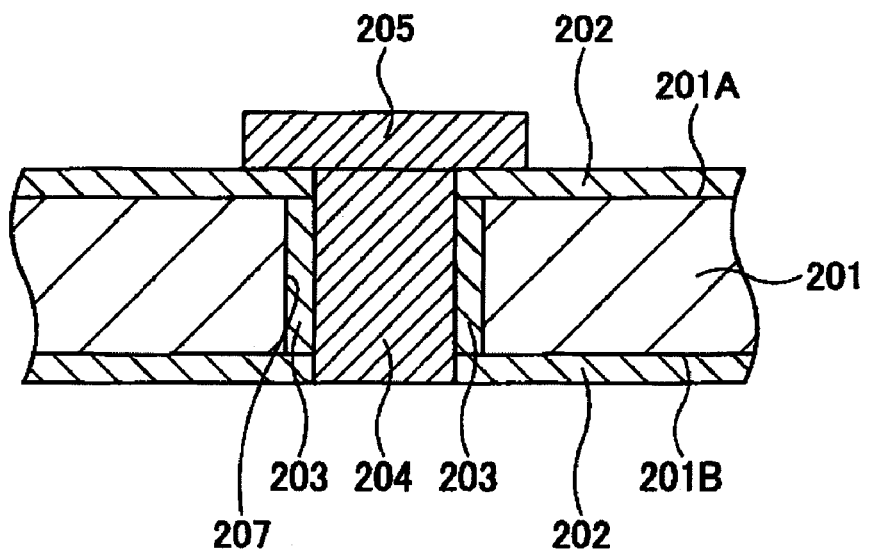
FIG. 8 is a view (Part 7) showing the process of producing the prior art substrate.
Figure 9:
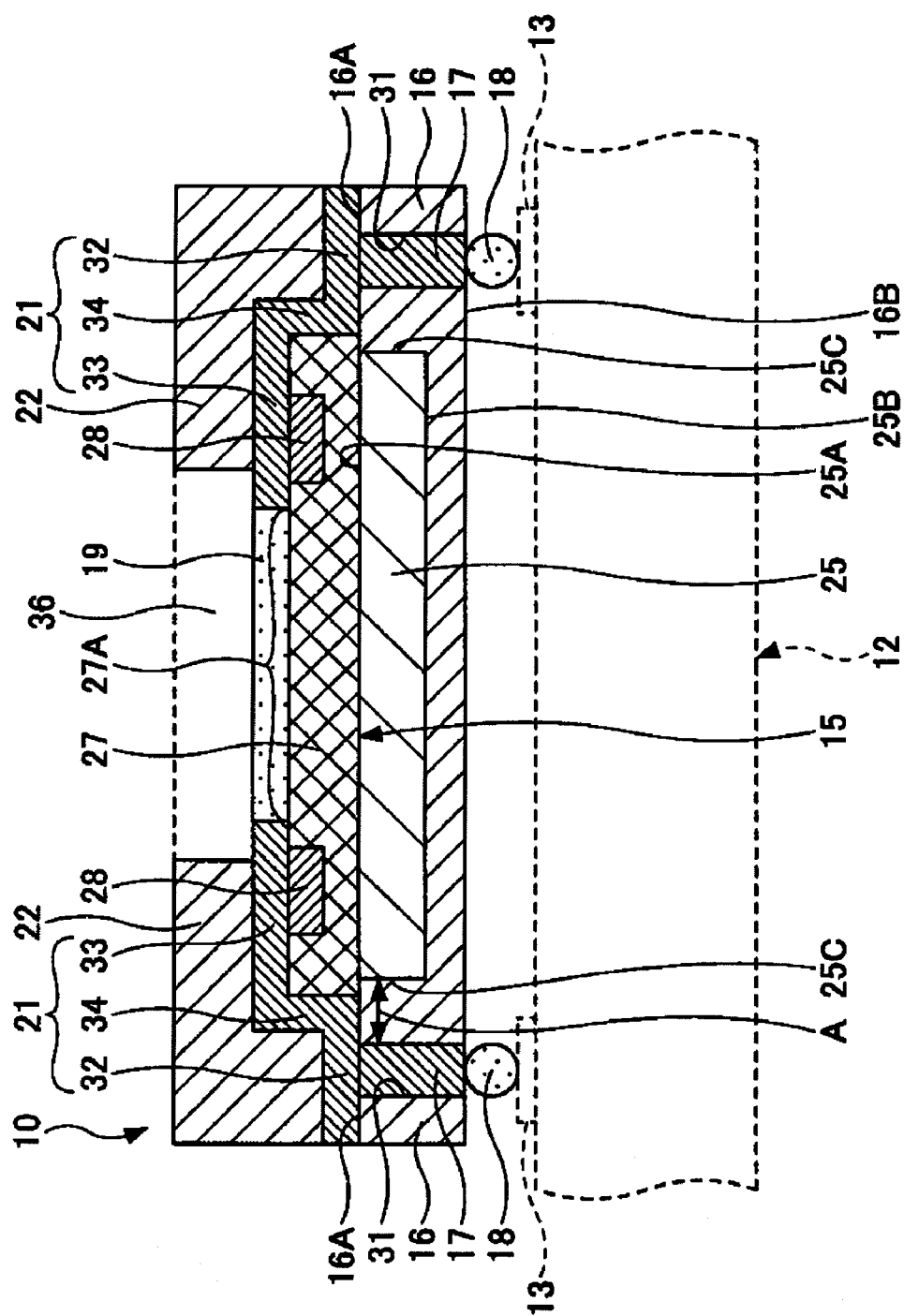
FIG. 9 is a sectional view showing a substrate according to Embodiment 1 of the present invention.
Figure 10:
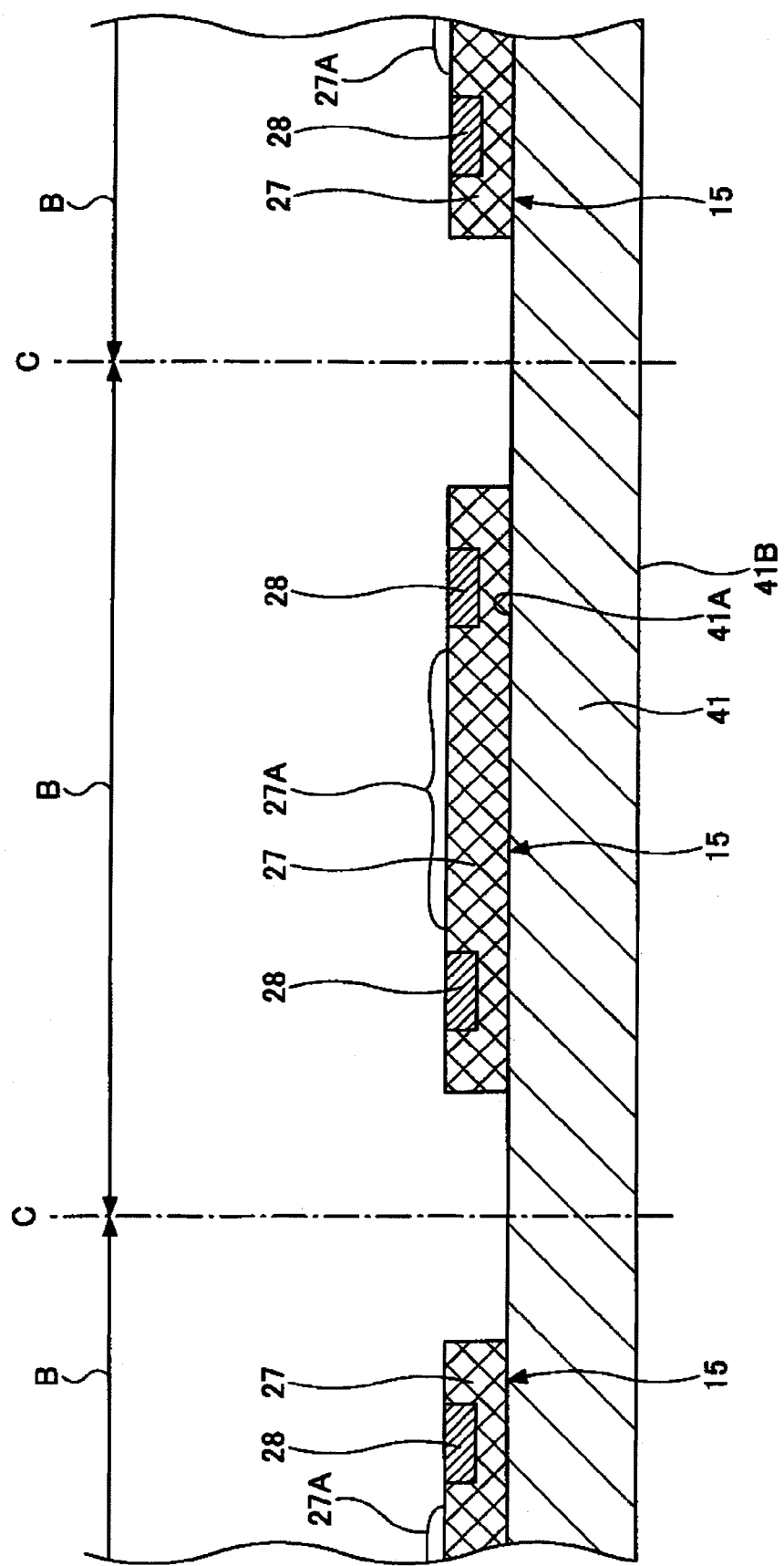
FIG. 10 is a view (Part 1) showing the process of producing a substrate according to Embodiment 1 of the present invention.

FIG. 9 is a sectional view of a substrate according to Embodiment 1 of the present invention.

Referring to FIG. 9, a substrate 10 according to Embodiment 1 includes a semiconductor device 15, insulative members 16, 22, a penetration electrode 17, a peripheral connection terminal 18, a translucent member 19, and a wiring pattern 21. Also, in the present embodiment, the following description is based on an example in which a CMOS sensor is used as the semiconductor device 15.

The semiconductor device 15 includes a semiconductor substrate 25, a device main body 27, and an electrode pad 28. The semiconductor substrate 25 is a thinned substrate. For example, a silicon substrate may be used as the semiconductor substrate 25. Where a silicon substrate is used as the semiconductor substrate 25, the thickness of the semiconductor substrate 25 may be, for example, 200 µm.

The device main body 27 is formed on the surface 25A side of the semiconductor substrate 25. The device main body 27 includes a diffusion layer (not illustrated) formed on the semiconductor substrate 25, a plurality of insulative layers (not illustrated) stacked on the semiconductor substrate 25, vias (not illustrated) electrically connected to the diffusion layer and formed on a plurality of insulative layers, and wirings (not illustrated) electrically connected to the vias and formed on a plurality of insulative layers. The device main body 27 has a light receiving portion 27A that receives light from the periphery.

The electrode pad 28 is electrically connected to the vias and wirings (not illustrated), which are formed on the device main body 27. The electrode pad 28 is connected to the wiring pattern 21. The electrode pad 28 is electrically connected to the penetration electrode 17 via the wiring pattern 21. For example, Al may be used as the material of the electrode pad 28.

The insulative member 16 is provided so as to cover the rear 25B and the side 25C of the semiconductor substrate 25. The upper surface 16A of the insulative member 16 is roughly flush with the surface 25A of the semiconductor substrate 25. The insulative member 16 has a through hole 31 that penetrates the insulative member 16 at the portion corresponding to the area where a pad 32 described later (one of the components of the wiring pattern 21) is formed. The insulative member 16 is a member that insulates the semiconductor substrate 25 and the penetration electrode 17 disposed in the through hole 31. The thickness of the insulative member 16 disposed on the rear 25B of the semiconductor substrate 25 may be, for example, 10 µm. For example, epoxy resin having a thermal hardening property may be used as the material of the insulative member 16.

The penetration electrode 17 is provided in the through hole 31 formed in the insulative member 16. The upper end of the penetration electrode 17 is connected to the pad 32. The lower end side of the penetration electrode 17 is roughly flush with the underside 16B of the insulative member 16. A peripheral connection terminal 18 is provided at the lower end of the penetration electrode 17. The penetration electrode 17 is electrically connected to the pad 13 provided on a mounted substrate 12 (for example, a mother board) via the peripheral connection terminal 18. The clearance A between the side of the penetration electrode 17 and the side 25C of the semiconductor substrate 25 may be, for example, 40 µm. For example, Cu may be used as the material of the penetration electrode 17. In addition, the diameter of the penetration electrode 17 may be, for example, 40 µm.

The peripheral connection terminal 18 is provided at the lower end of the penetration electrode 17. The peripheral connection terminal 18 is a terminal for electrically connecting the penetration electrode 17 provided at the substrate 10 to the pad 13 provided on the mounted substrate 12. For example, a bump (for example, a soldering bump) may be used as the peripheral connection terminal 18.

The translucent member 19 is provided so as to cover the upper surface of the light receiving portion 27A of the device main body 27. The translucent member 19 is a member for protecting the light receiving portion 27A. For example, silicone resin may be used as the translucent member 19. Where silicone resin is used as the translucent member 19, the thickness of the translucent member 19 may be, for example, 10 μm through 100 μm.

The wiring pattern 21 has pads 32, 33 and wiring 34. The pad 32 is provided on the upper surface 16A of the insulative member 16 and at the upper end of the penetration electrode 17. The pad 32 is connected to the upper end of the penetration electrode 17. The pad 32 is integral with the wiring 34. The pad 32 is electrically connected to the pad 33 via the wiring 34.

The pad 33 is provided on the electrode pad 28. The pad 33 is connected to the electrode pad 28. The pad 33 is integral with the wiring 34, and is electrically connected to the pad 32 via the wiring 34. The wiring 34 is provided on the device main body 27 so that the pad 32 and the pad 33 are electrically connected to each other. For example, Cu may be used as the material of the wiring pattern 21 as described above.

The insulative member 22 is disposed so that it covers the upper surface and side of the wiring pattern 21, the upper surface and side of the device main body 27 at the portion excluding the light receiving portion 27A, and the upper surface of the insulative member 16. The insulative member 22 has an opening portion 36 by which the translucent member 19 is exposed. The opening portion 36 is to transmit light from the periphery to the light receiving portion 27A. For example, epoxy resin having a thermal hardening property may be used as the insulative member 22.

FIGS. 10 to 25 are views showing processes for producing a substrate according to Embodiment 1 of the present invention. FIG. 26 is a plan view of a structure shown in FIG. 18. In FIGS. 10 to 26, components that are the same as those of the substrate 10 according to Embodiment 1 are given the same reference numerals.

Referring to FIGS. 10 to 26, a description is given of a method for producing the substrate 10 according to Embodiment 1. First, in the process shown in FIG. 10, a semiconductor device 15 (CMOS sensor in the case of the present embodiment) is formed, by a publicly known method, at the surface 41A side of a semiconductor substrate 41 having a plurality of substrate-forming areas B where the substrate 10 is formed (semiconductor device forming step). For example, a silicon wafer may be used as the semiconductor substrate 41. Where a silicon wafer is used as the semiconductor substrate 41, the thickness of the semiconductor substrate 41 may be, for example, 725 μm. The semiconductor substrate 41 is thinned in the process shown in FIG. 13 described later, and if it is cut off at the cutting position C, a plurality of semiconductor substrates 25 (Refer to FIG. 9) will be brought about.

Figure 11:
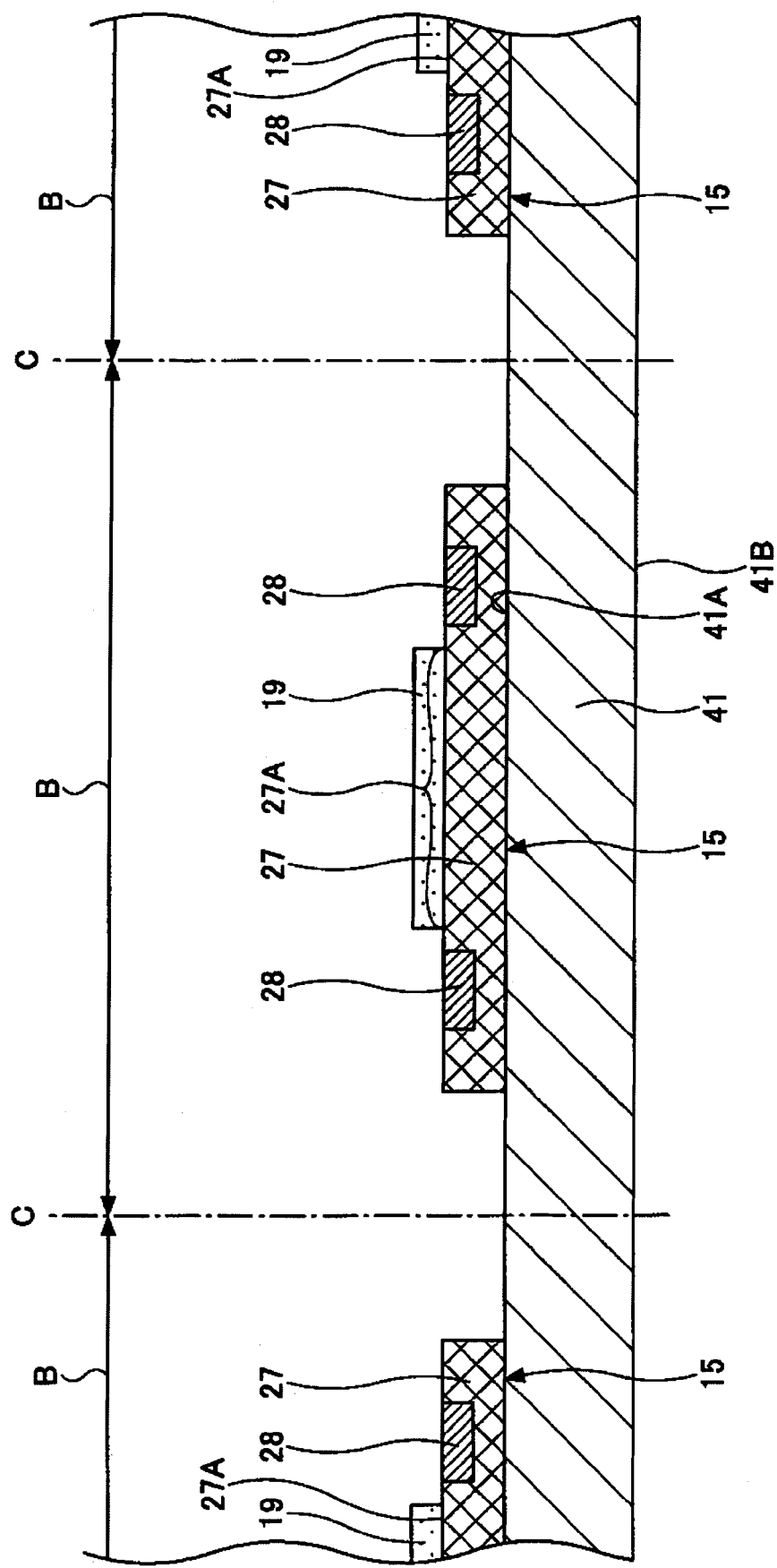
FIG. 11 is a view (Part 2) showing the process of producing a substrate according to Embodiment 1 of the present invention.

Next, in the process shown in FIG. 11, a translucent member 19 is formed so as to cover the upper surface of the light receiving portion 27A. For example, silicone resin may be used as the translucent member 19. Where silicone resin is used as the translucent member 19, the translucent member 19 may be formed by, for example, a printing method and ink jet method, etc. In this case, the thickness of the translucent member 19 may be, for example, 10 μm through 100 μm.

Figure 12:
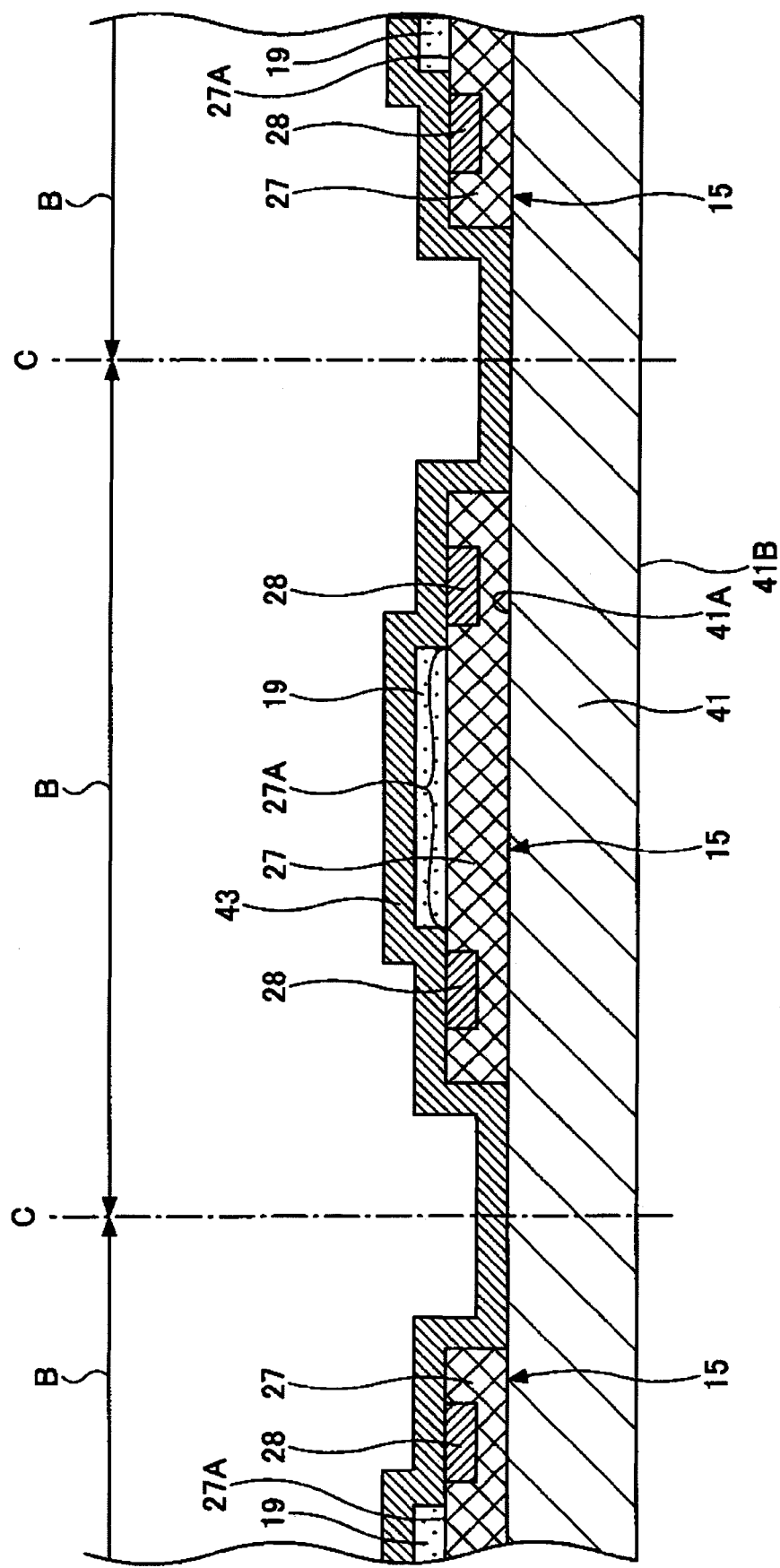
FIG. 12 is a view (Part 3) showing the process of producing a substrate according to Embodiment 1 of the present invention.

Next, in the process shown in FIG. 12, a metallic film 43 that becomes the matrix of the wiring pattern 21 (Refer to FIG. 9) is formed so that it covers the semiconductor device 15 and the surface 41A of the semiconductor substrate 41 (Metallic film forming step). In detail, for example, a seed layer (not illustrated) is formed so as to cover the semiconductor device 15 and the surface 41A of the semiconductor substrate 41 by a sputtering method, and next, a plating film (not illustrated) is grown by precipitation on the seed layer by an electrolytic plating method in which the seed layer is made into a power feeding layer, thereby forming a metallic film 43. For example, a Cu layer, a Cu/Ti layer or a Cu/Cr layer (for example, 0.1 μm thick) may be used as the seed layer described above. In addition, for example, a Cu-plated film (for example, 3 μm through 5 μm thick) may be used as the above-described plated film.

Figure 13:
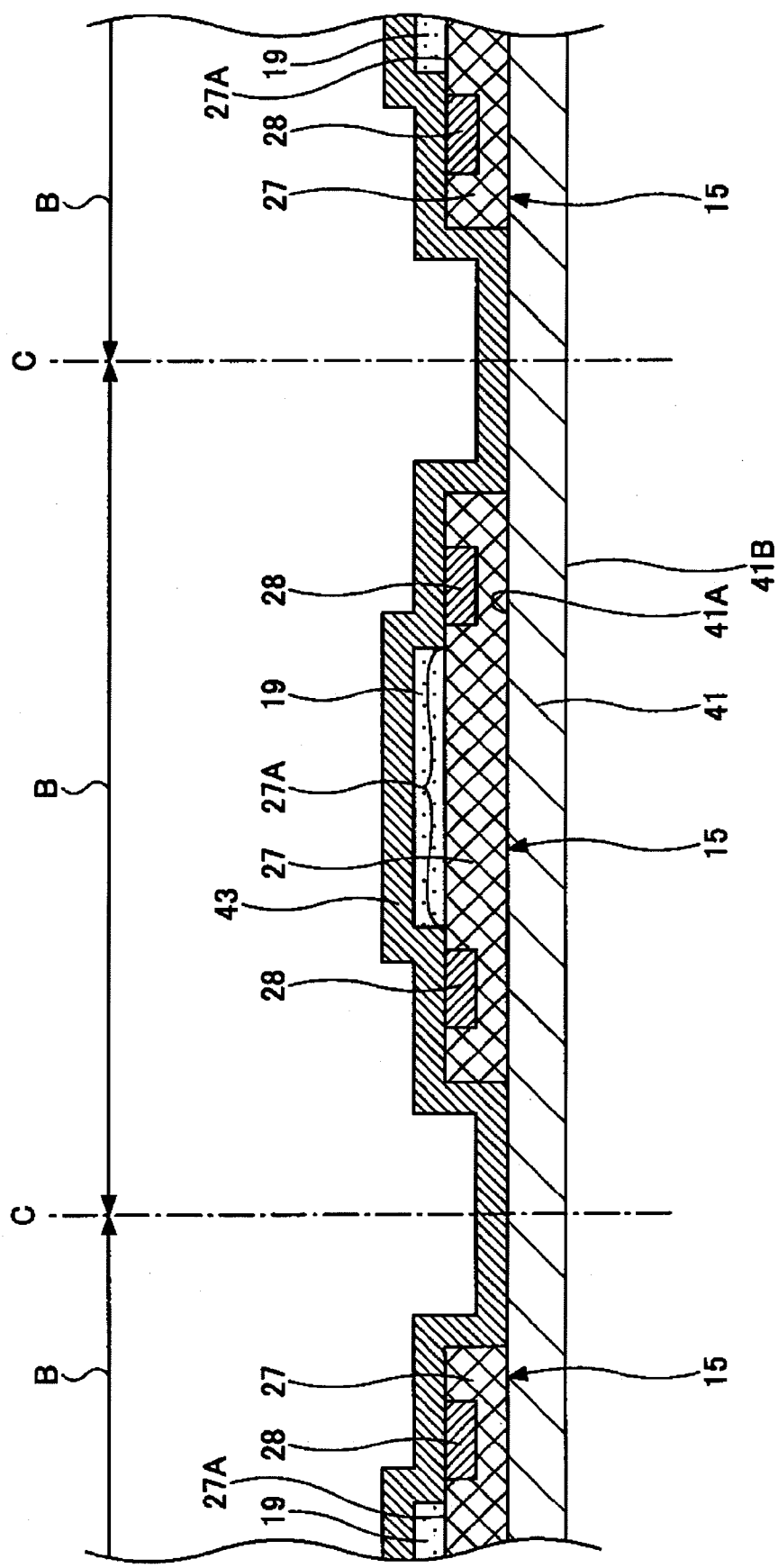
FIG. 13 is a view (Part 4) showing the process of producing a substrate according to Embodiment 1 of the present invention.

Next, in the process shown in FIG. 13, the semiconductor substrate 41 shown in FIG. 12 is thinned. In detail, the semiconductor substrate 41 is thinned by grinding and/or polishing the semiconductor substrate 41 from the rear 41B side of the semiconductor 41 shown in FIG. 12. The thickness of the thinned semiconductor substrate 41 may be, for example, 200 μm.

Figure 14:
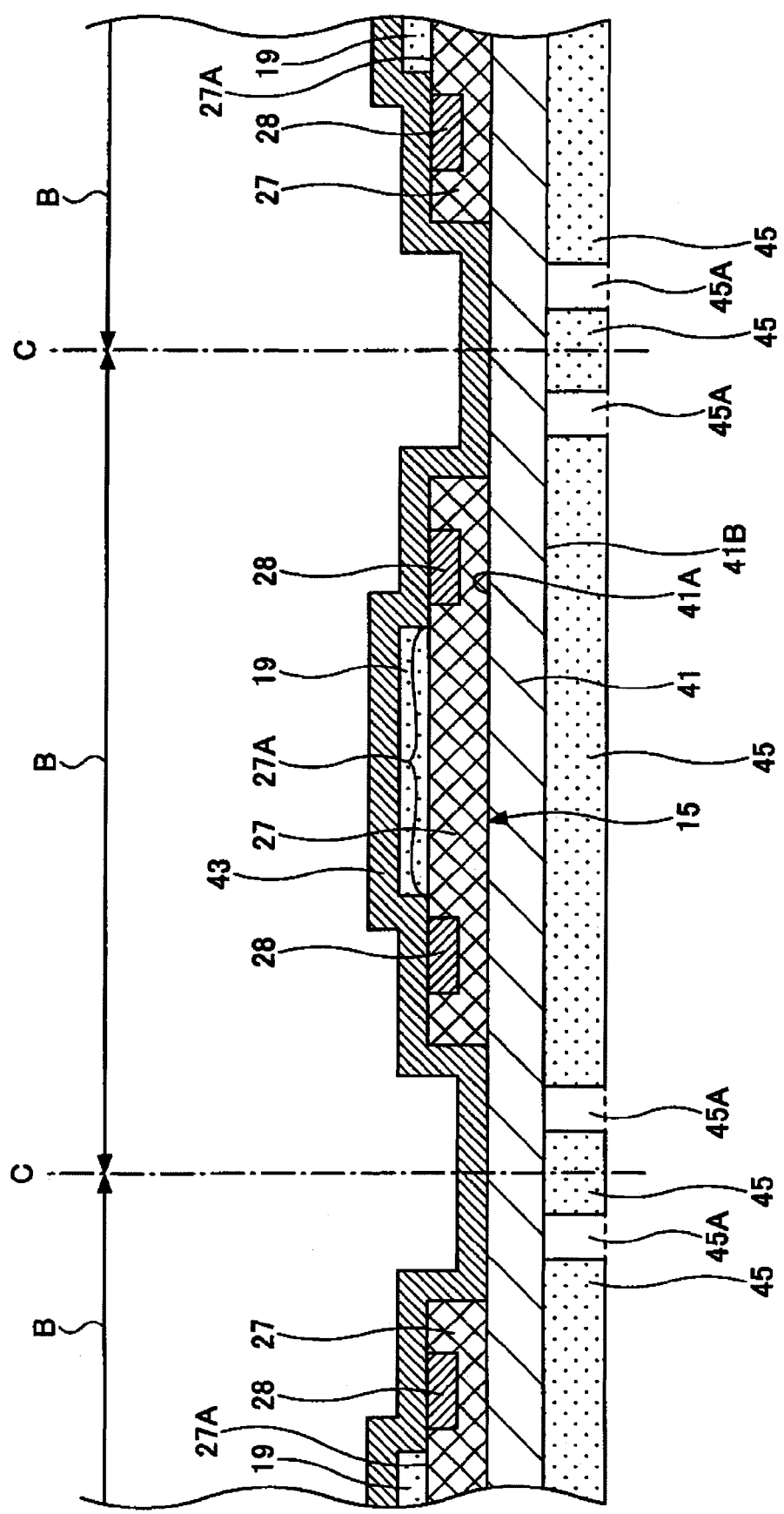
FIG. 14 is a view (Part 5) showing the process of producing a substrate according to Embodiment 1 of the present invention.

Next, in the process shown in FIG. 14, a resist film 45 having an opening portion 45A is formed on the rear 41B of the thinned semiconductor substrate 41. At this time, the opening portion 45A is formed so as to expose the rear 41B of the semiconductor substrate 41 at the portion corresponding to the area where the through hole 31 (Refer to FIG. 9) is formed.

Figure 15:
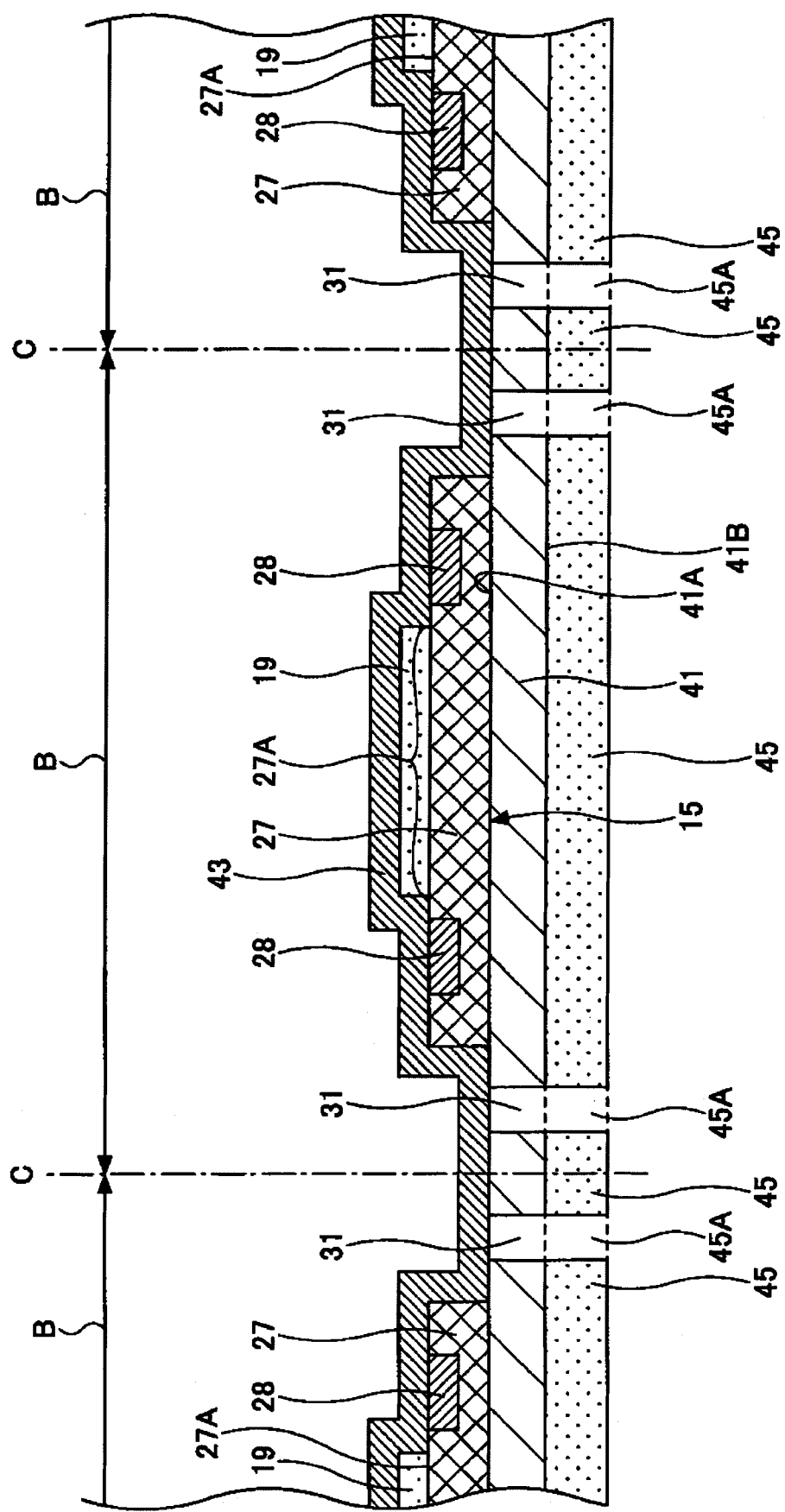
FIG. 15 is a view (Part 6) showing the process of producing a substrate according to Embodiment 1 of the present invention.

Next, in the process shown in FIG. 15, the through hole 31 is formed by etching the semiconductor substrate 41 at the portion exposed to the opening portion 45A until the metallic film 43 is exposed, by means of anisotropic etching (for example, dry etching) in which the resist film 45 is made into a mask (through hole forming step).

Figure 16:
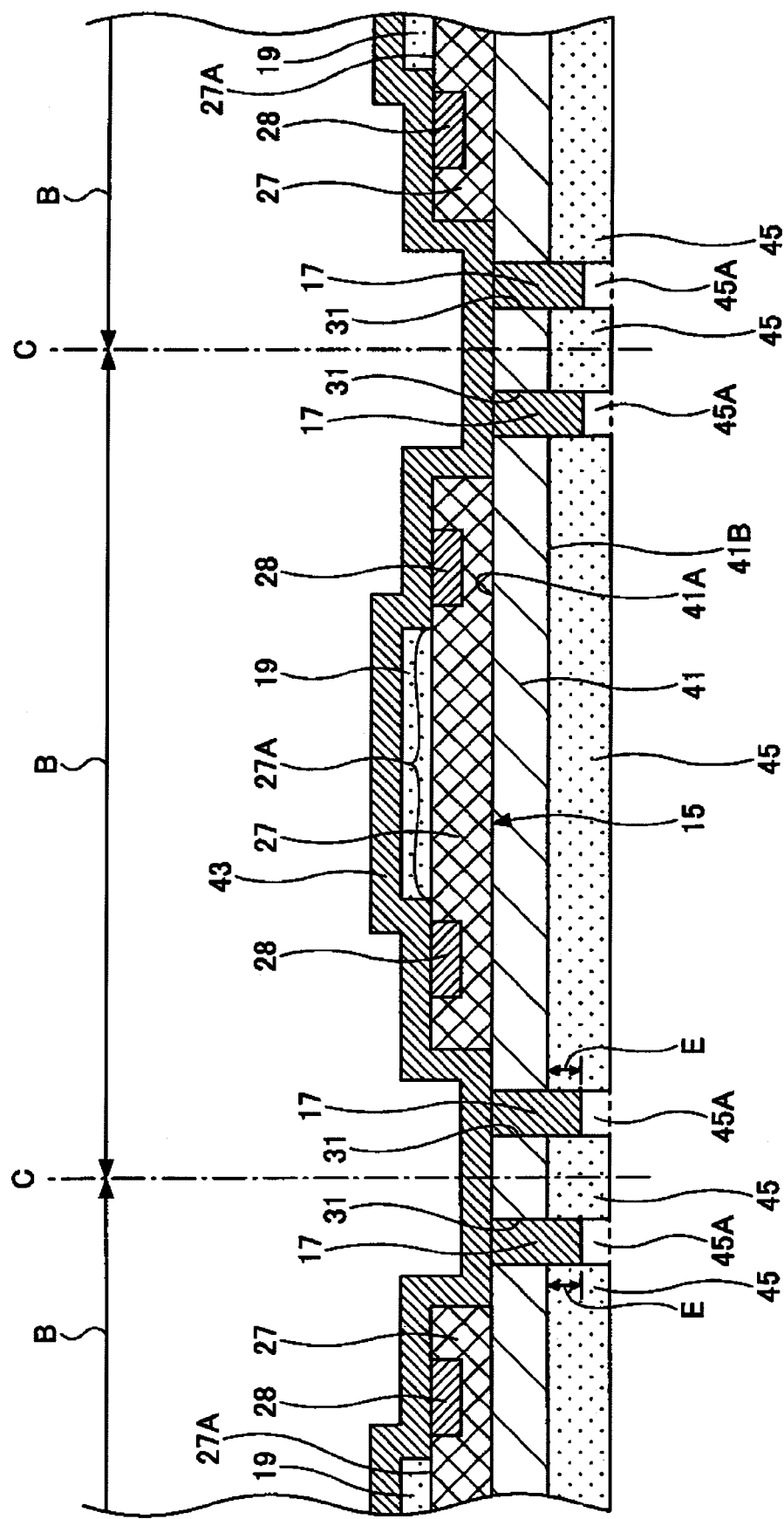
FIG. 16 is a view (Part 7) showing the process of producing a substrate according to Embodiment 1 of the present invention.

Next, in the process shown in FIG. 16, the penetration electrode 17 is formed in the through hole 31 (penetration electrode forming step). In detail, a plated film (for example, a Cu-plated film) is grown by precipitation in the through hole 31 by an electrolytic plating method in which the metallic layer 43 is used as a power feeding layer, thereby forming the penetration electrode 17. Besides, the penetration electrode 17 may be formed by electrical conductive paste.

Thus, since by forming the penetration electrode 17 before patterning the metallic film 43, the metallic film 43 can be used as a power feeding layer when forming the penetration electrodes 17 in a plurality of substrate-formed areas B, it is possible to form penetration electrodes 17 at a plurality of through holes 31 provided in a plurality of substrate-formed areas B at the same time.

Also, since there will be no case where the insulative member intervenes between the metallic film 43 at the portion corresponding to the matrix of the pad 32 and the upper end of the penetration electrode 17, it becomes possible to prevent the resistance value between the penetration electrode 17 and the pad 32 from increasing. Therefore, the yield of the substrate 10 can be improved.

In the penetration electrode forming step, the penetration electrode 17 is formed so that the lower end of the penetration electrode 17 protrudes from the rear 41B of the semiconductor substrate 41.

Thus, by forming the penetration electrode 17 so that the lower end of the penetration electrode 17 protrudes from the rear 41B of the semiconductor substrate 41, a peripheral connection terminal 18 can be connected to the lower end of the penetration electrode 17 where the insulative member 16 is attached to the rear 41B of the semiconductor substrate 41.

The protrusion amount E of the penetration electrode 17 may be, for example, roughly equal to the value of the thickness of the insulative member 16 formed on the rear 41B of the semiconductor substrate 41. In detail, where the thickness of the insulative member 16 formed on the rear 41B of the semiconductor substrate 41 is 10 μm, the protrusion amount E of the penetration electrode 17 may be, for example, 10 μm.

Figure 17:
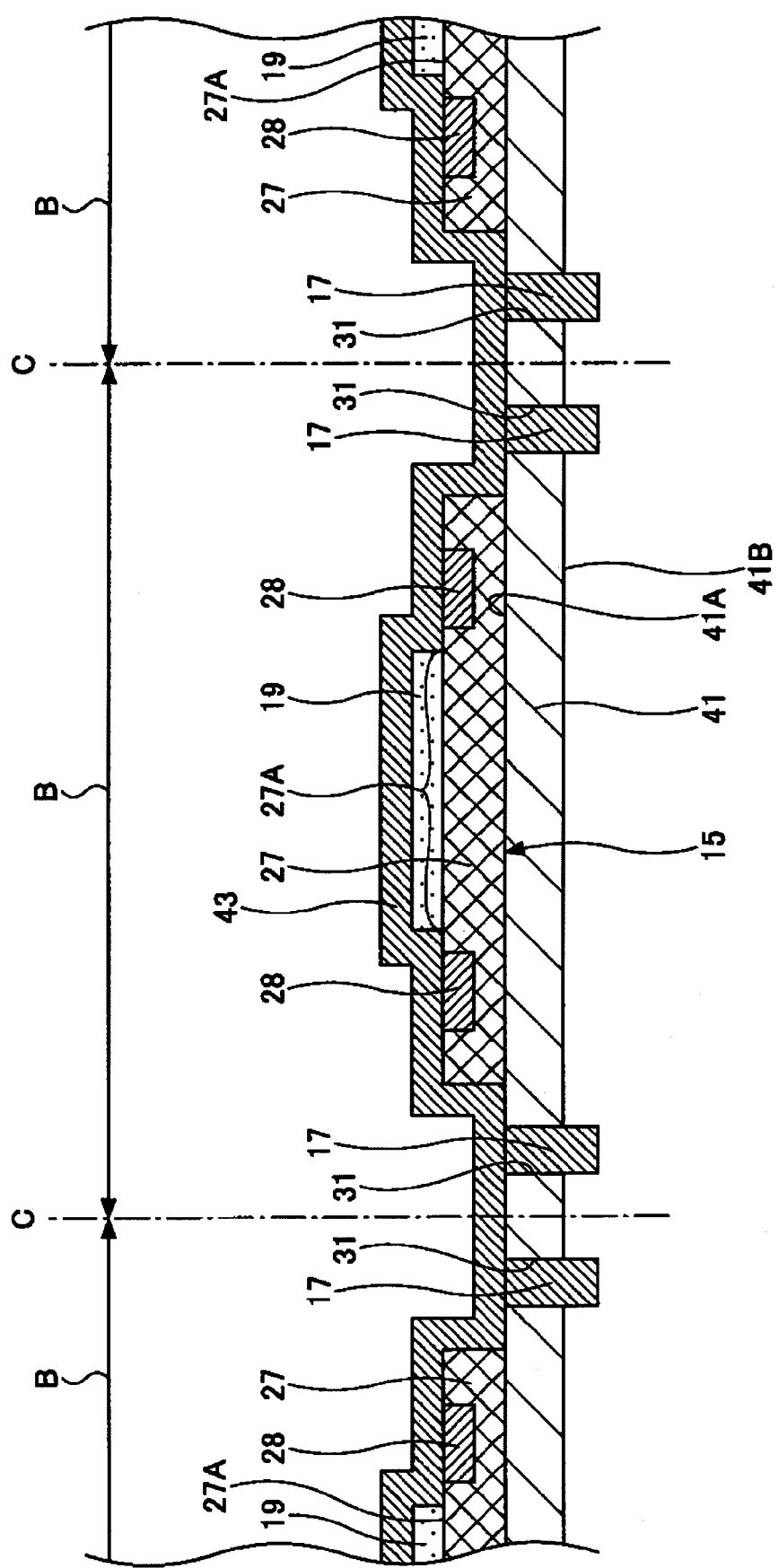
FIG. 17 is a view (Part 8) showing the process of producing a substrate according to Embodiment 1 of the present invention.
Figure 18:
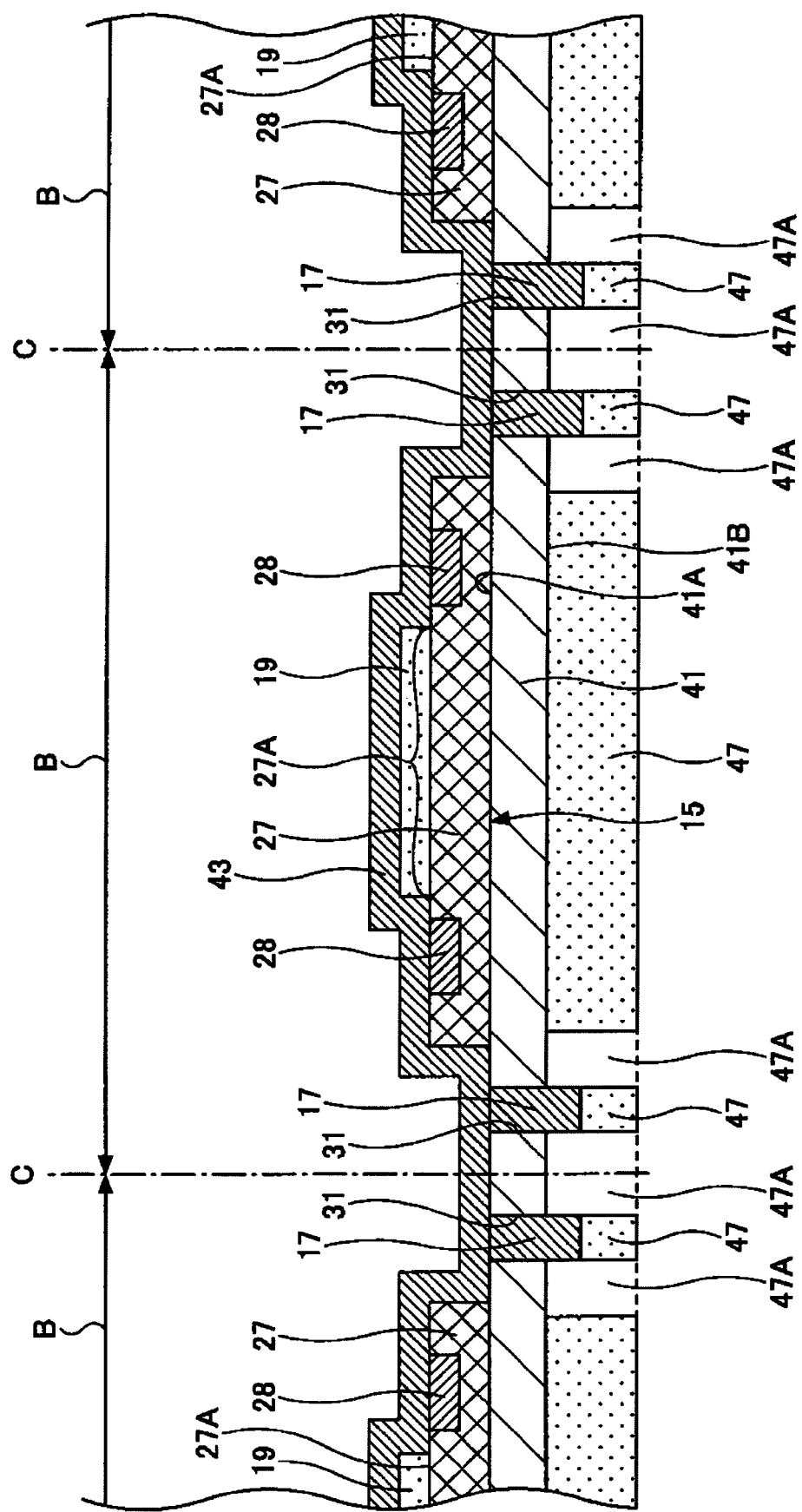
FIG. 18 is a view (Part 9) showing the process of producing a substrate according to Embodiment 1 of the present invention.

Next, in the process shown in FIG. 17, the resist film 45 provided on the structure shown in FIG. 16 is removed. Next, in the process shown in FIG. 18, a resist film 47 having an opening portion 47A, which exposes the rear 41B of the semiconductor substrate 41 at the portion corresponding to an area where a penetration portion 49 (Refer to FIG. 19) described later, is formed on the rear 41B of the semiconductor 41 (As for a view in which the structure shown in FIG. 17 is observed in a plan view, refer to FIG. 26).

Subsequently, in the process shown in FIG. 19, the penetration portion 49 is formed by etching the semiconductor substrate 41 until the underside of the metallic film at the portion corresponding to the pad 32 is exposed, by means of anisotropic etching for which the resist film 47 is used as a mask (Penetration portion forming step). The penetration portion 49 is a portion where an insulative material (matrix of the insulative member 16) is filled up to insulate between the semiconductor substrate 41 and the penetration electrode 17. That is, the penetration portion 49 is an area where a part of the insulative member 16 is disposed. It is better that the penetration portion 49 is formed so as to expose the side of at least two or more penetration electrodes 17 provided at the substrate-formed area B.

Thus, by forming the penetration portion 49 so that the sides of at least two or more penetration electrodes 17 provided at the substrate-formed area B are exposed, the insulative material (matrix of the insulative member 16) can be further easily filled up in the penetration portion 49 in comparison with a case where penetration portions to expose only the side of a single penetration electrode 17 are formed by a plurality, wherein it is possible to accurately fill up the penetration portion 49 with an insulative material (matrix of the insulative member 16).

Figure 19:
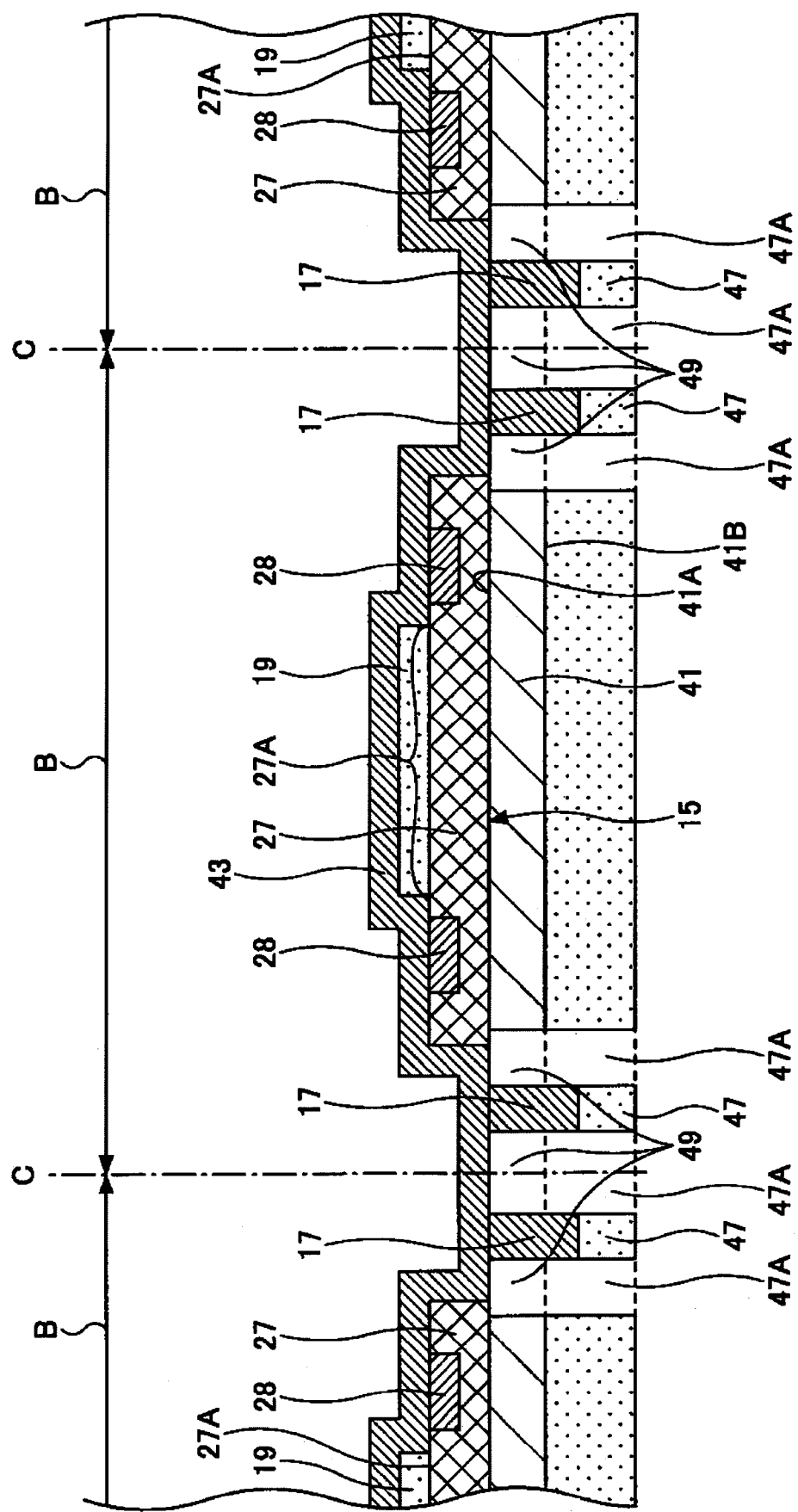
FIG. 19 is a view (Part 10) showing the process of producing a substrate according to Embodiment 1 of the present invention.
Figure 20:
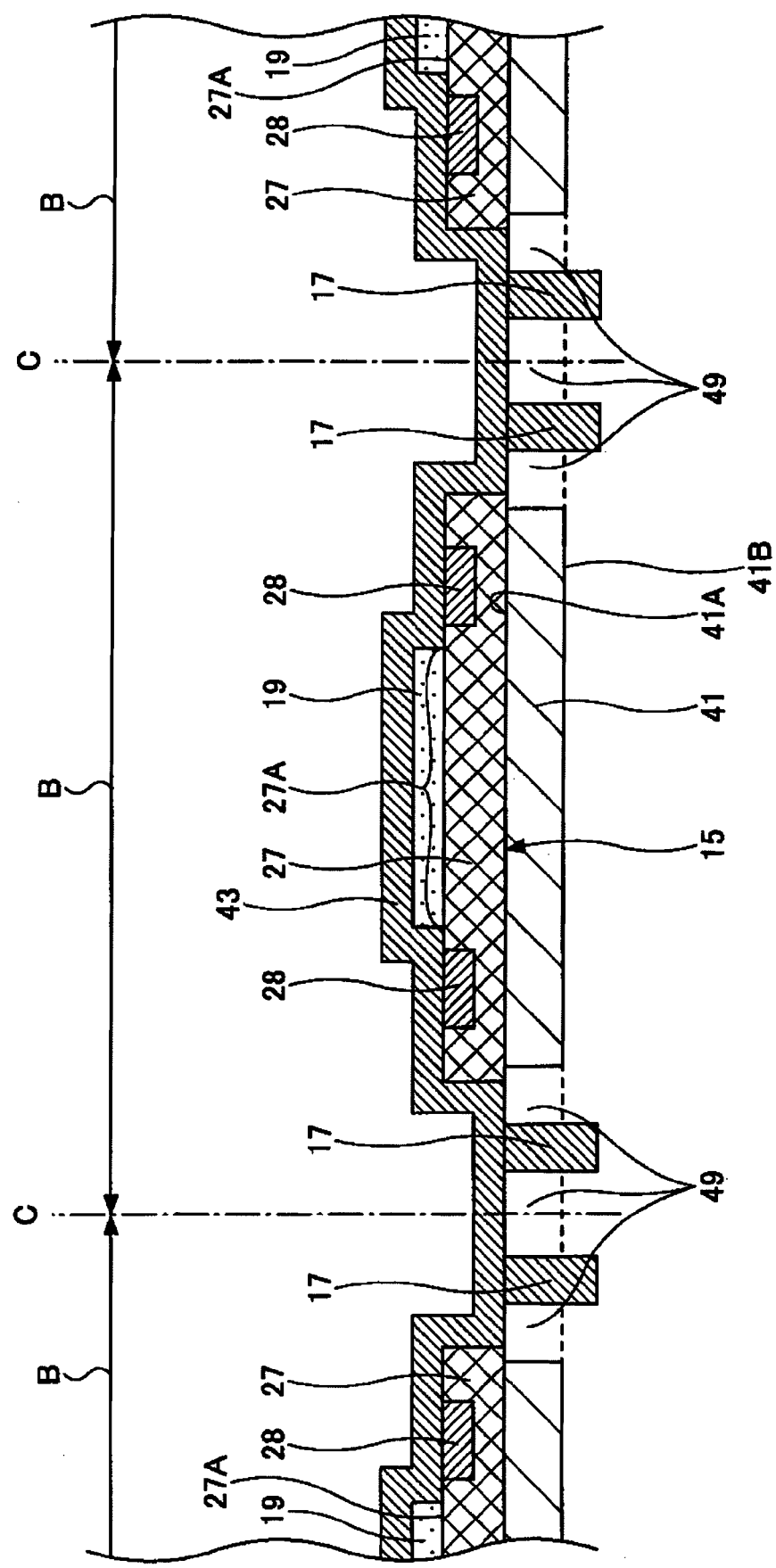
FIG. 20 is a view (Part 11) showing the process of producing a substrate according to Embodiment 1 of the present invention.

Next, in the process shown in FIG. 20, the resist film 47 provided on the structure shown in FIG. 19 is removed. Next, in the process shown in FIG. 21, for example, the penetration portion 49 is filled up by a printing method, and simultaneously, the insulative material (matrix of the insulative member 16) is disposed so as to cover the rear 41B of the semiconductor substrate 41 in a state where the lower end of the penetration electrode 17 is exposed (in detail, for example, in a state where the lower end side of the penetration electrode 17 is roughly flush with the underside 16B of the insulative member 16). After that, the insulative member 16 is formed by hardening the insulative material (insulative material forming step). Besides, the insulative member may be formed by an inkjet-method or a spin-coating method.

Thus, by forming the insulative member 16 to insulate between the penetration electrode 17 and the semiconductor substrate 41, there is no case where the thickness of the insulative member 16 disposed between the penetration electrode 17 and the semiconductor substrate 41 is thinned, wherein it is possible to sufficiently secure the insulation property between the penetration electrode 17 and the semiconductor substrate 41.

For example, thermal hardening type epoxy resin may be used as the above insulative material. In this case, the insulative material may be hardened by heating the insulative material so that the temperature thereof becomes 150° C. or so.

Figure 21:
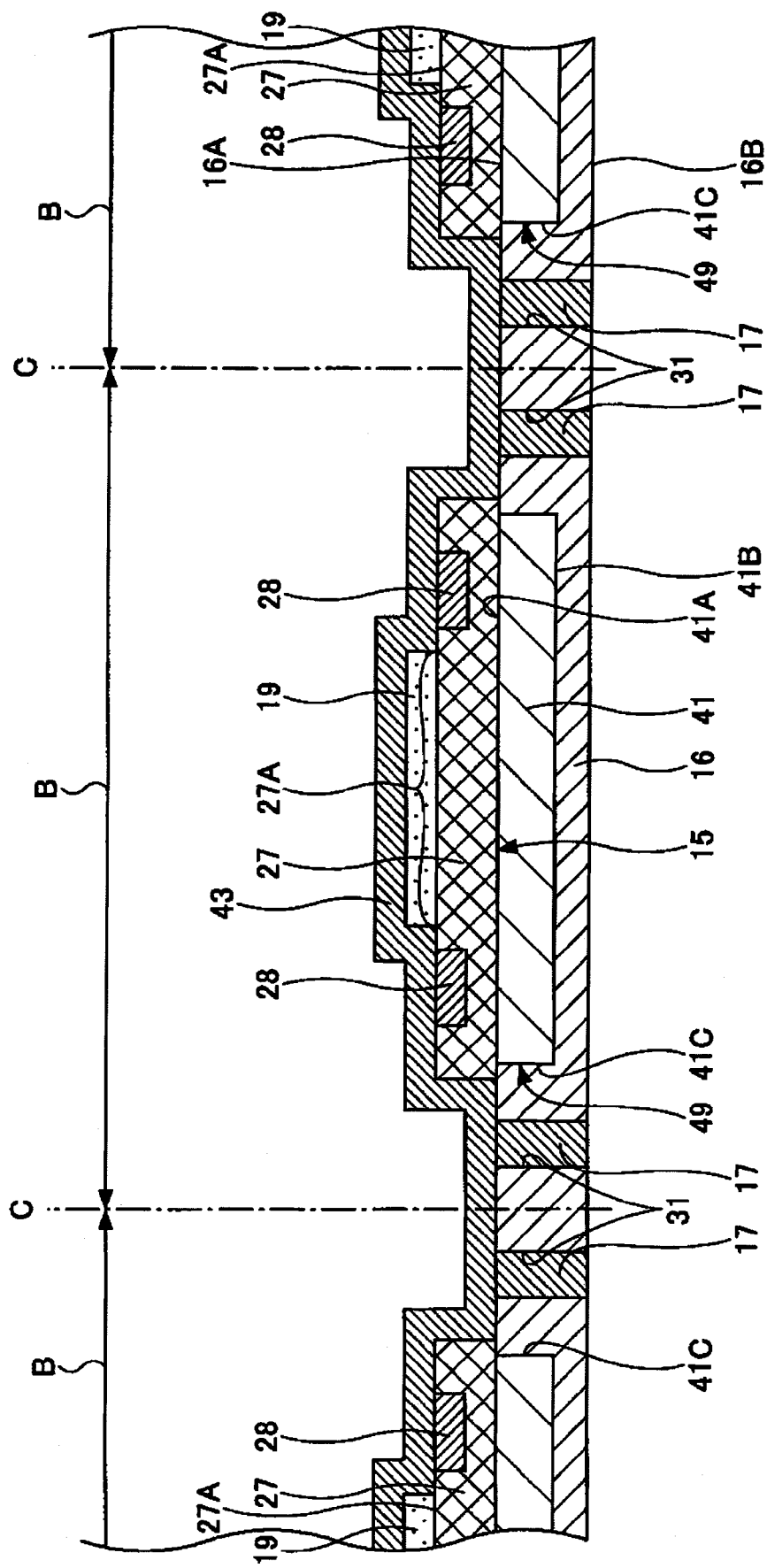
FIG. 21 is a view (Part 12) showing the process of producing a substrate according to Embodiment 1 of the present invention.
Figure 22:
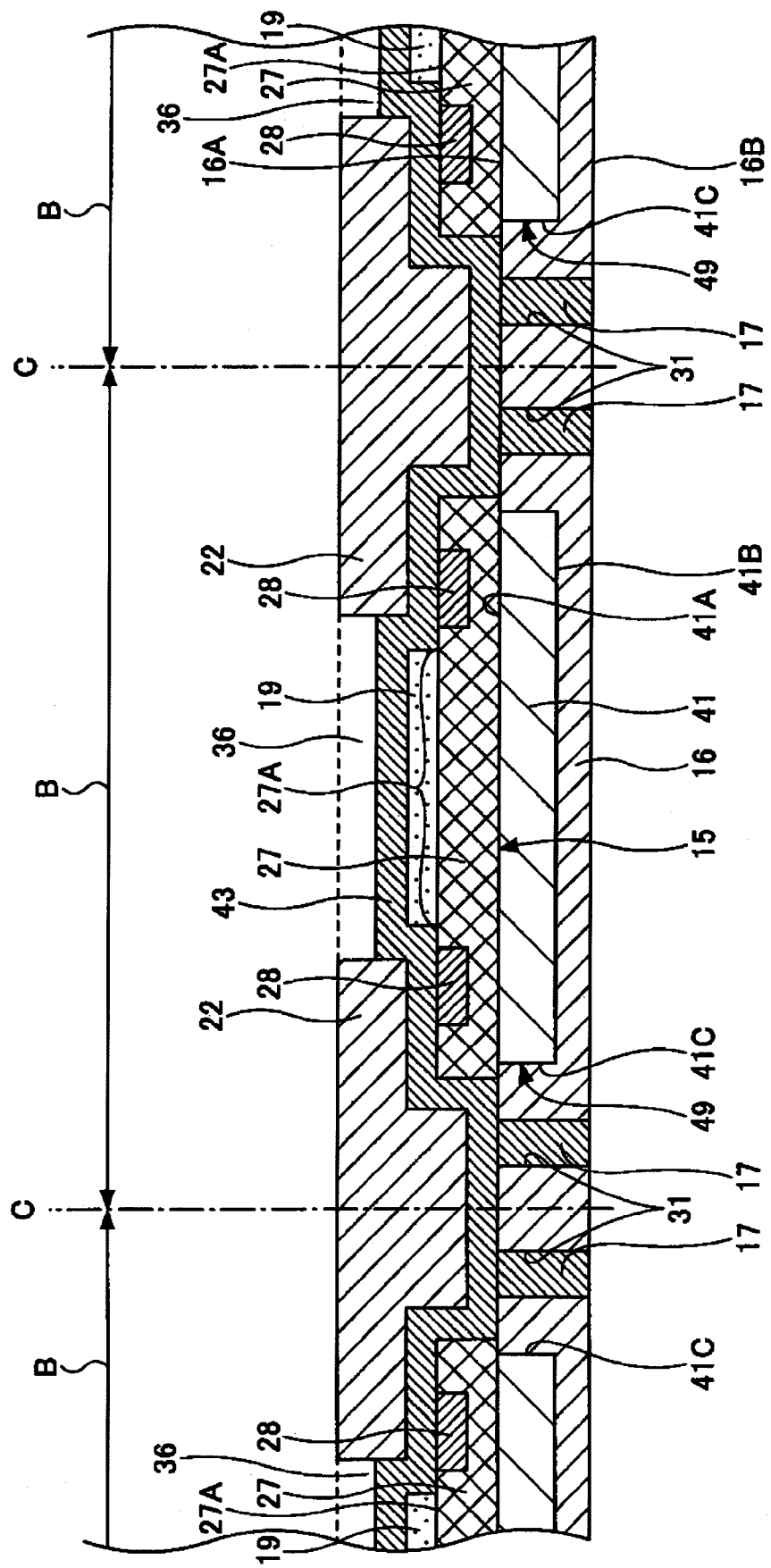
FIG. 22 is a view (Part 13) showing the process of producing a substrate according to Embodiment 1 of the present invention.

Next, in the process shown in FIG. 22, the insulative member 22 is formed on the upper surface side of the structure shown in FIG. 21, which has the opening portion 36 that exposes the metallic film 43 at the portion disposed on the translucent member 19 and exposes the metallic film 43 at the portion corresponding to the area other than the area where the wiring pattern 21 is formed. For example, thermal hardening type epoxy resin may be used as the insulative member 22.

Figure 23:
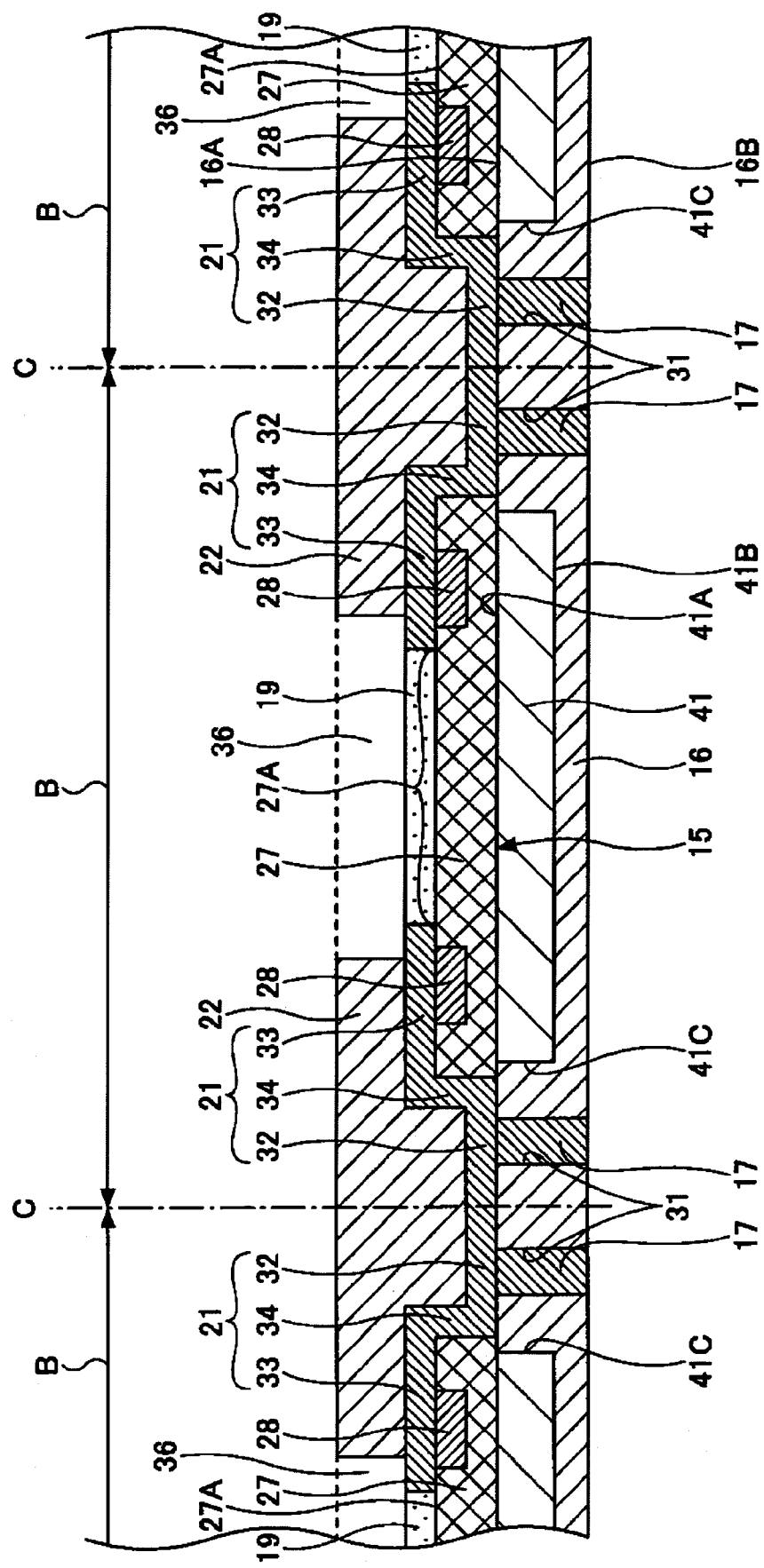
FIG. 23 is a view (Part 14) showing the process of producing a substrate according to Embodiment 1 of the present invention.

Next, in the process shown in FIG. 23, the metallic film 43 at the portion exposed to the opening portion 36 shown in FIG. 22 is removed by etching (for example, dry etching) for which the insulative member 22 is made into a mask, whereby the metallic film 43 is patterned (Pad forming step). Accordingly, the metallic film 43 formed on the translucent member 19 is removed, and simultaneously, a wiring pattern 21 equipped with the pads 32, 33 and wiring 34 is formed. In addition, in this stage, since the wiring pattern 21 formed at the adjacent substrate-formed area B is integral, the pad 32 formed at the adjacent substrate-formed area B is electrically connected.

Thus, the metallic film 43 that becomes the matrix of the pad 32 is formed on the semiconductor substrate 41, and thereafter, the through hole 31 is formed in the semiconductor substrate 41 at the portion facing the metallic film 43 at the portion corresponding to the area where the pad 32 is formed. Next, a penetration electrode 71 is formed in the through hole 31. Next, a penetration portion 49 to expose the side of the penetration electrode 17 is formed in the semiconductor substrate 41. After that, the insulative member 16 is formed by filling up at least the penetration portion 49 with an insulative material. After that, the pad 32 is formed by patterning the metallic film 43, wherein there will be no case where the insulative material intervenes between the pad 32 and the penetration electrode 17 (that is, the resistance value between the penetration electrode 17 and the pad 32 does not increase). Simultaneously, it becomes possible to sufficiently secure the thickness of the insulative material disposed between the side of the penetration electrode 17 and the semiconductor substrate 41 (that is, the insulative property between the penetration electrode 17 and the semiconductor substrate 41 can be sufficiently secured). Therefore, the yield of the substrate 10 can be improved.

Figure 24:
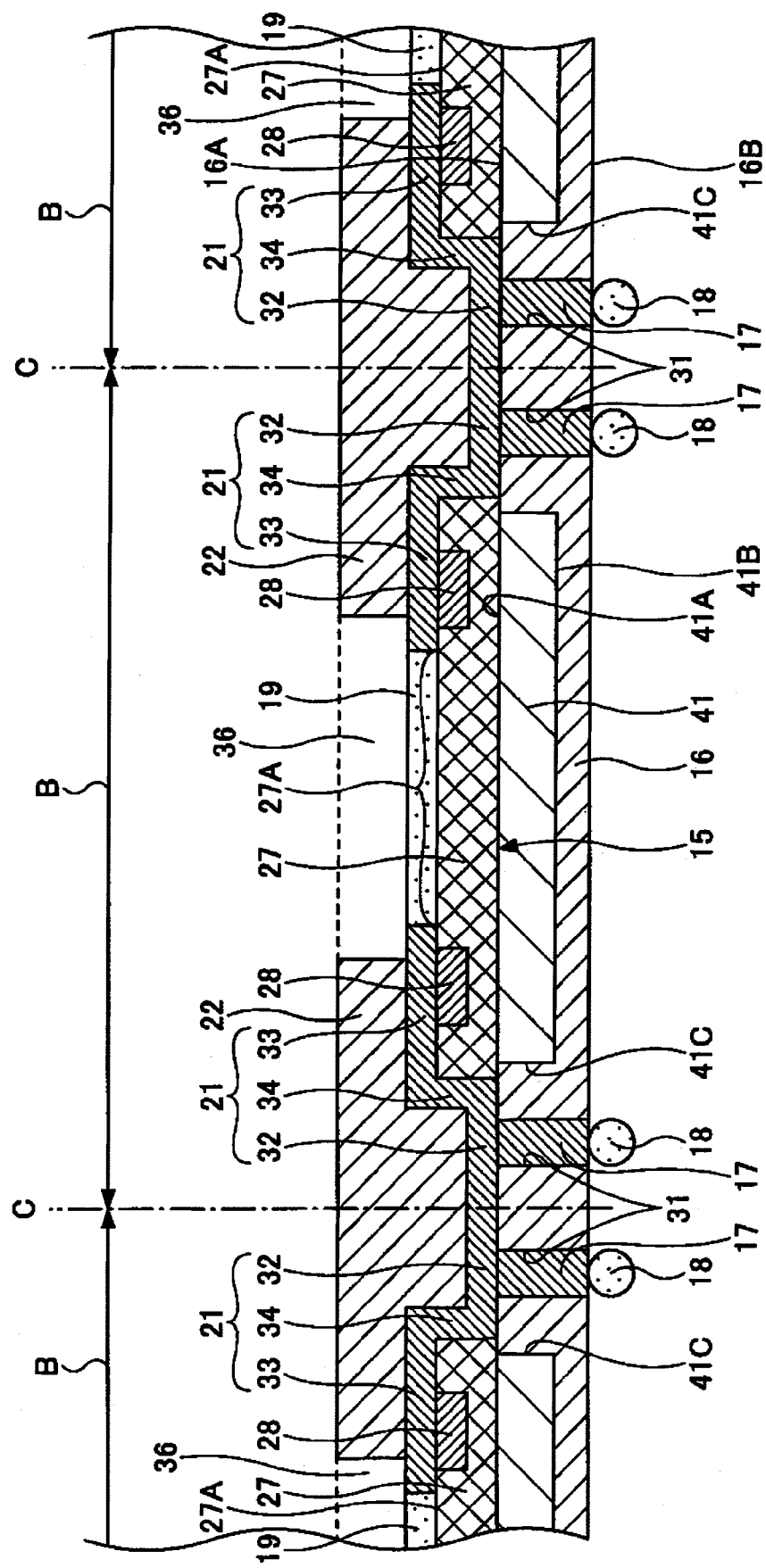
FIG. 24 is a view (Part 15) showing the process of producing a substrate according to Embodiment 1 of the present invention.

Next, in the process shown in FIG. 24, the peripheral connection terminal 18 is formed at the lower end of the penetration electrode 17. Therefore, structures equivalent to the substrates 10 (Refer to FIG. 9) are formed at a plurality of substrate-formed areas B, respectively. For example, a bump (for example, a soldering bump) may be used as the peripheral connection terminal 18.

Figure 25:
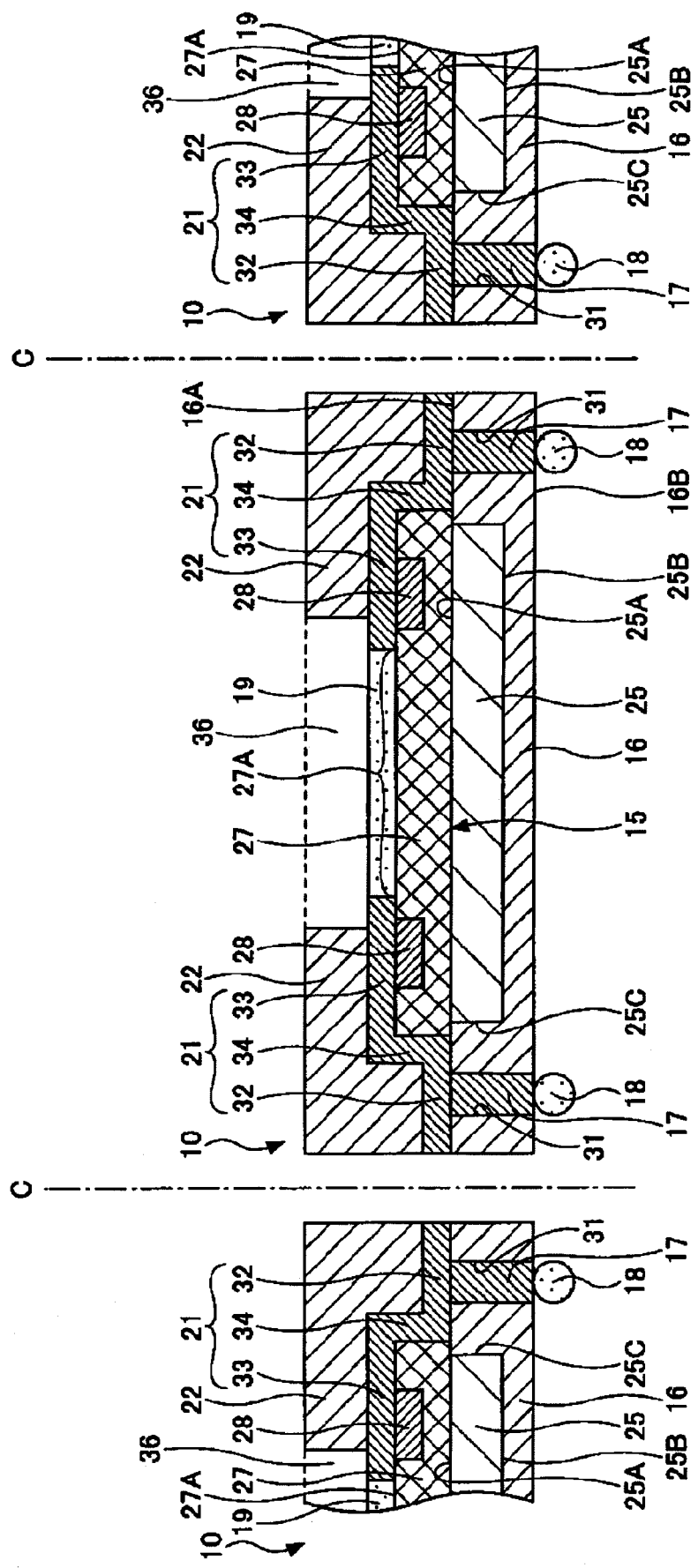
FIG. 25 is a view (Part 16) showing the process of producing a substrate according to Embodiment 1 of the present invention.
Figure 26:
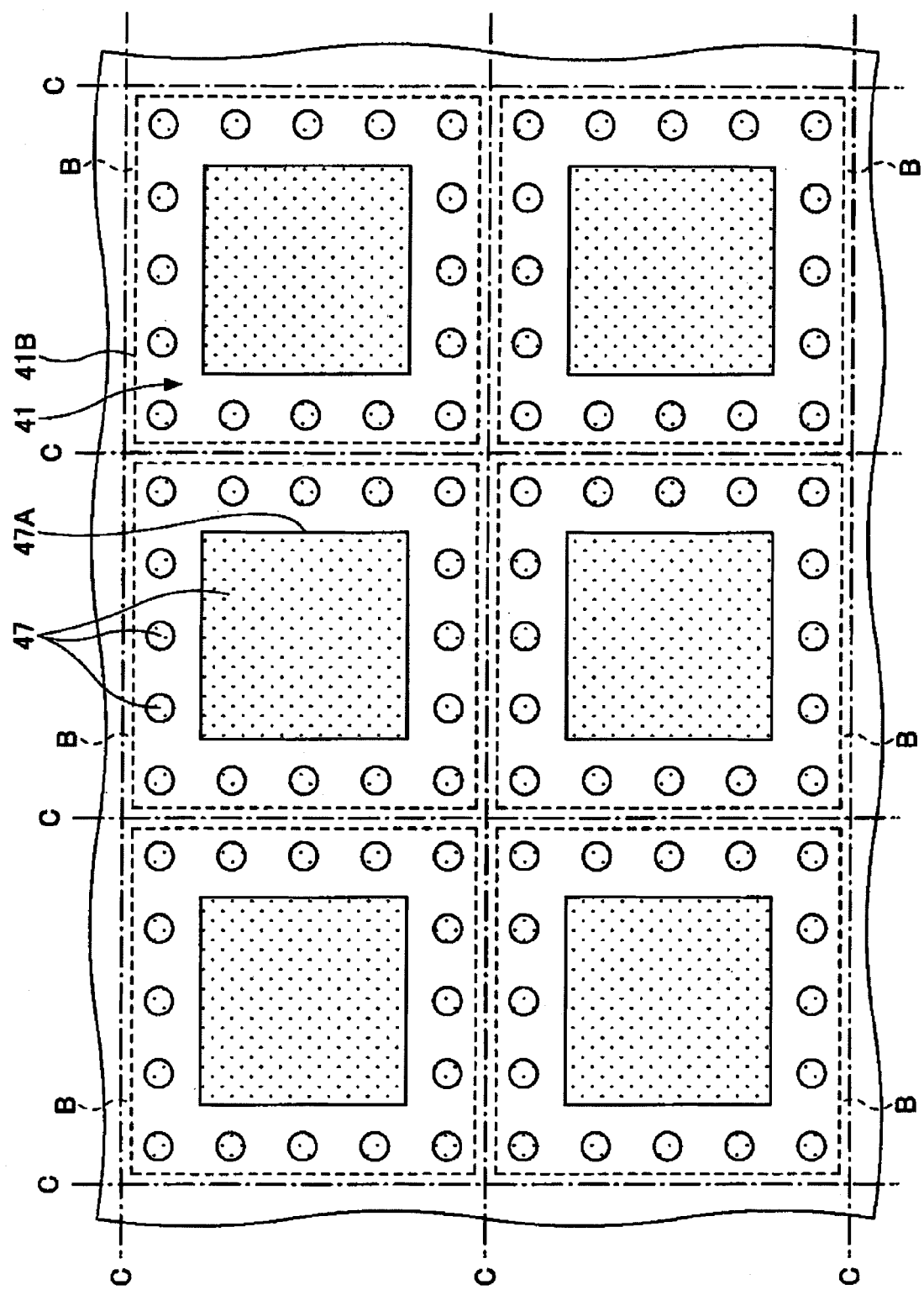
FIG. 26 is a plan view showing a structure shown in FIG. 18.

Next, in the process shown in FIG. 25, a plurality of substrates 10 are individuated by cutting the structure shown in FIG. 24 along the cutting position C.

With the method for producing substrates according to the present embodiment, the metallic film 43 that becomes the matrix of the pad 32 is formed on the semiconductor substrate 41, and thereafter, the through hole 31 is formed in the semiconductor substrate 41 at the portion facing the metallic film 43 at the portion corresponding to the area where the pad 32 is formed. Next, a penetration electrode 17 is formed in the through hole 31. Next, a penetration portion 49 to expose the side of the penetration electrode 17 is formed in the semiconductor substrate 41. After that, the insulative member 16 is formed by filling up at least the penetration portion 49 with an insulative material. After that, the pad 32 is formed by patterning the metallic film 43, wherein there will be no case where the insulative material intervenes between the pad 32 and the penetration electrode 17 (that is, the resistance value between the penetration electrode 17 and the pad 32 does not increase). Simultaneously, it becomes possible to sufficiently secure the thickness of the insulative material disposed between the side of the penetration electrode 17 and the semiconductor substrate 41 (that is, the insulative property between the penetration electrode 17 and the semiconductor substrate 41 can be sufficiently secured). Therefore, the yield of the substrate 10 can be improved.

Also, in the present embodiment, a description is given, as an example, of a case where the penetration portion 49 is formed so as to expose the sides of a plurality of penetration electrodes 17 provided at the substrate-formed area B where the substrate is formed. However, the penetration portions to expose only the side of a single penetration electrode 17 are formed by a plurality, and after that, these plurality of penetration portions may be filled up with an insulative material.

Embodiment 2

Figure 27:
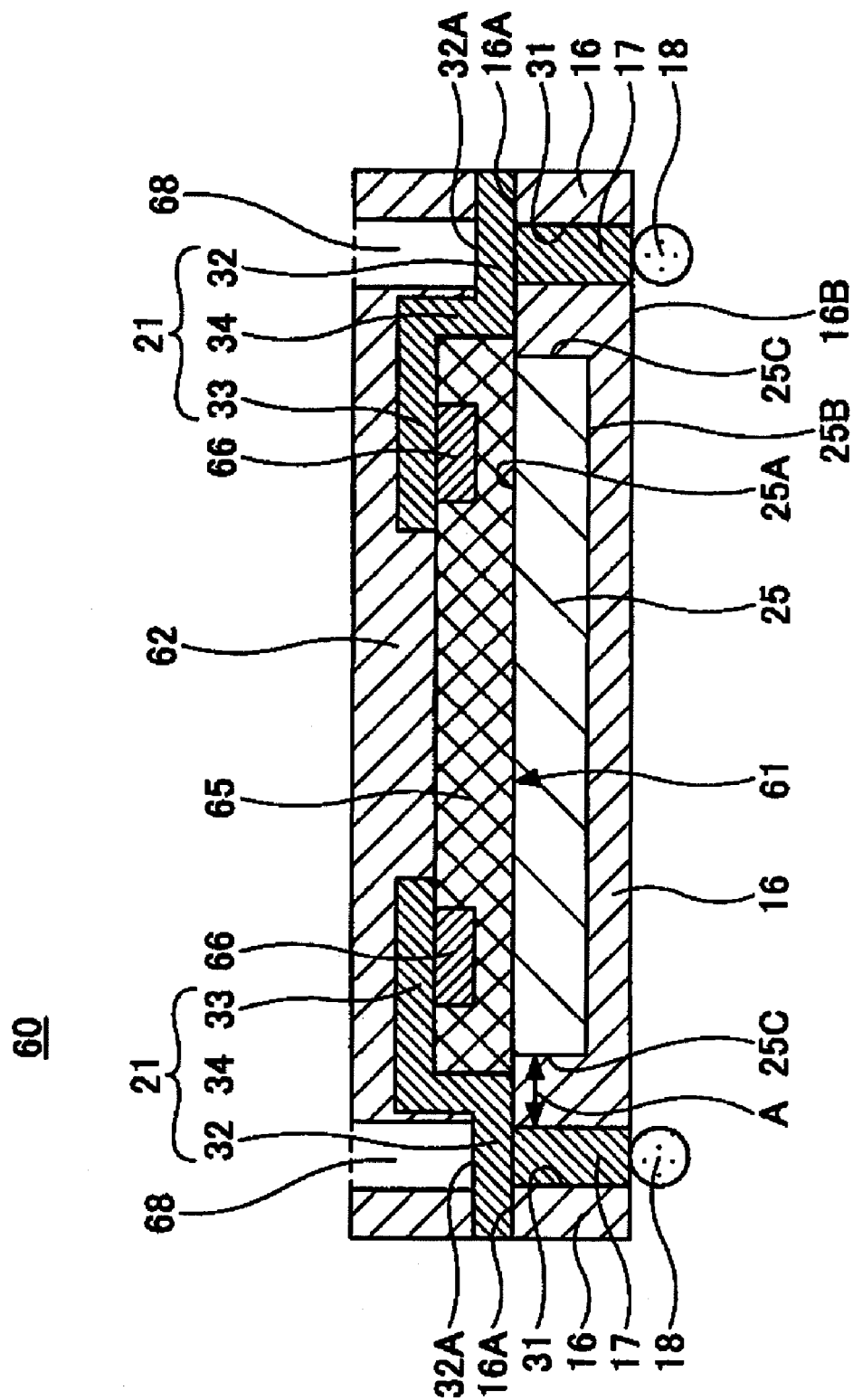
FIG. 27 is a sectional view showing a substrate according to Embodiment 2 of the present invention.

FIG. 27 is a sectional view of a substrate according to Embodiment 2 of the present invention. In FIG. 27, components that are identical to those of the substrate 10 according to Embodiment 1 are given the same symbols.

Referring to FIG. 27, a substrate 60 according to Embodiment 2 is structured as well as the substrate 10, except that a semiconductor device 61 and an insulative member 62 are provided instead of the semiconductor device 15 and the insulative member 22 provided at the substrate 10 according to Embodiment 1, and the translucent member 19 provided at the substrate 10 is excluded from the components.

The semiconductor device 61 includes a semiconductor substrate 25, a device main body 65 and an electrode pad 66. The device main body 65 is formed on the surface 25A side of the semiconductor substrate 25. The device main body 65 includes a diffusion layer (not illustrated) formed on the semiconductor substrate 25, a plurality of insulative layers (not illustrated) stacked on the semiconductor substrate 25, vias (not illustrated) electrically connected to the diffusion layer and formed on a plurality of stacked insulative layers, and wirings (not illustrated) electrically connected to the vias and formed on a plurality of stacked insulative layers.

The electrode pad 66 is electrically connected to the via and the wiring (not illustrated) formed in the device main body 65. The electrode pad 66 is connected to the pad 33. Accordingly, the electrode pad 66 is electrically connected to the pad 32 connected to the penetration via 17 via the pad 33 and wiring 34. For example, Al may be used as the material of the electrode pad 66. For example, a semiconductor device for memory may be used as the semiconductor device 61 as described above.

The insulative member 62 is provided on the upper surface 16A of the insulative member 61 so that it covers the wiring pattern 21 and the semiconductor device 16 excluding a part of the upper surface 32A of the pad 32. The insulative member 62 has an opening portion 68 to expose a part of the upper surface 32A of the pad 32. For example, a thermal-hardening type epoxy resin may be used as the material of the insulative member 62. Also, the diameter of the opening portion 68 may be, for example, 40 μm.

Thus, since the opening portion 68 to expose a part of the upper surface 32A of the pad 32 is provided on the insulative member 62, another substrate (in detail, a substrate 70 described later (Refer to FIG. 28)) is disposed upward of the substrate 60, and the pad 32 provided on the substrate 60 may be electrically connected to a pad provided on the substrate.

The substrate 60 according to Embodiment 2 as described above may be produced by the method similar to that of the substrate 10 described with respect to Embodiment 1, and effects similar to those of the method for producing substrate 10 according to Embodiment 1 can be brought about.

Figure 28:
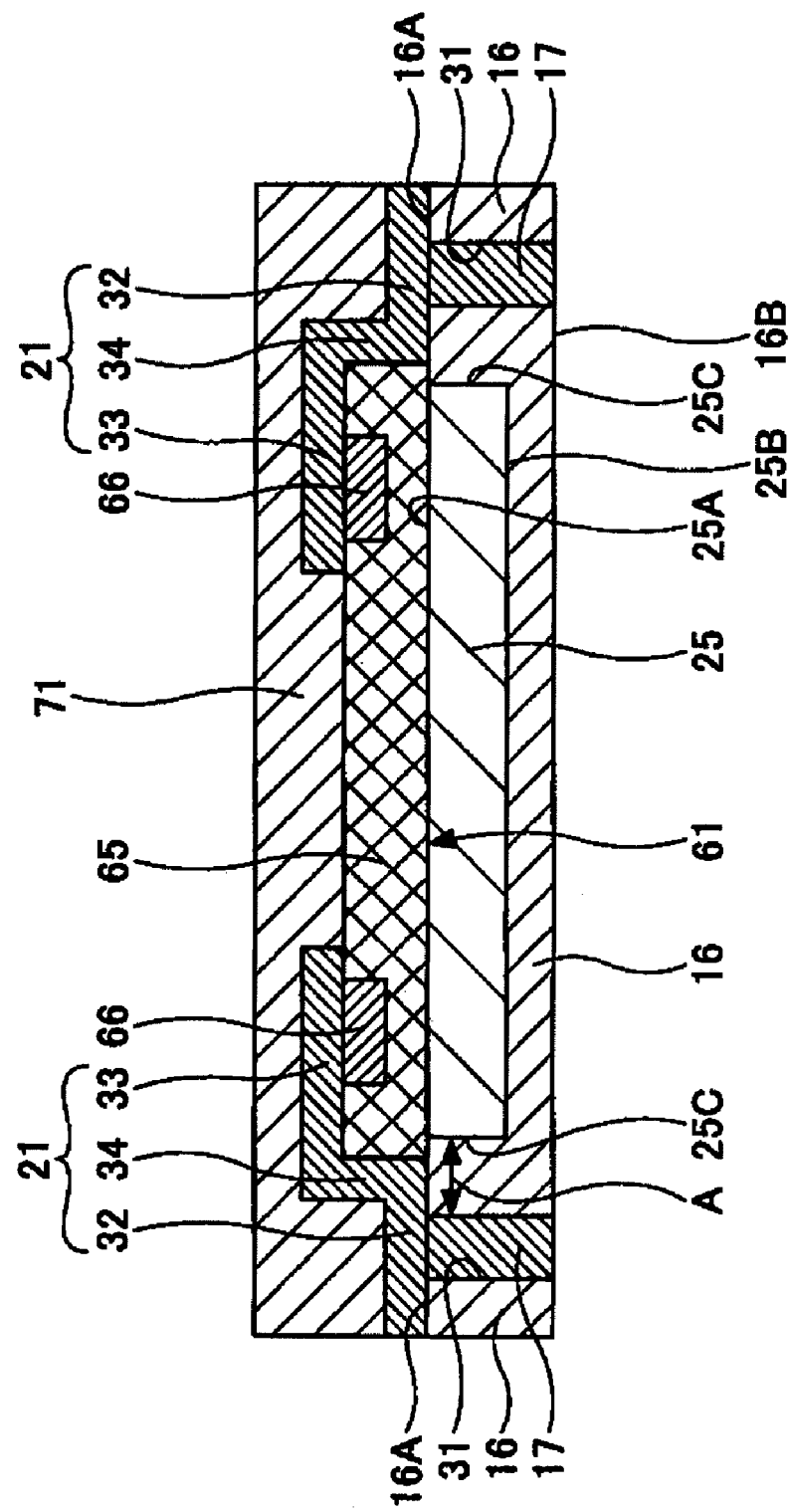
FIG. 28 is a sectional view showing a substrate according to a modified version of Embodiment 2 of the present invention.

FIG. 28 is a sectional view showing a substrate according to a modified version of Embodiment 2 of the present invention. In FIG. 28, components that are identical to those of the substrate 60 according to Embodiment 2 are given the same symbols.

Referring FIG. 28, the substrate 70 according to the modified version of Embodiment 2 is structured as well as the substrate 60, except that an insulative member 71 is provided instead of the insulative member 62 provided at the substrate 60 according to Embodiment 2, and the peripheral connection terminal 18 provided at the substrate 60 is excluded from the components.

The insulative member 71 is provided on the upper surface 16A of the insulative member 16 so that it covers the wiring pattern 21 and the semiconductor device 61. For example, a thermal hardening type epoxy resin may be used as the material of the insulative member 71.

The substrate 70 according to the modified version of Embodiment 2 as described above may be produced by the manner similar to that of the substrate 10 described with respect to Embodiment 1, and effects similar to those of the method for producing substrate 10 according to Embodiment 1 can be brought about.

Figure 29:
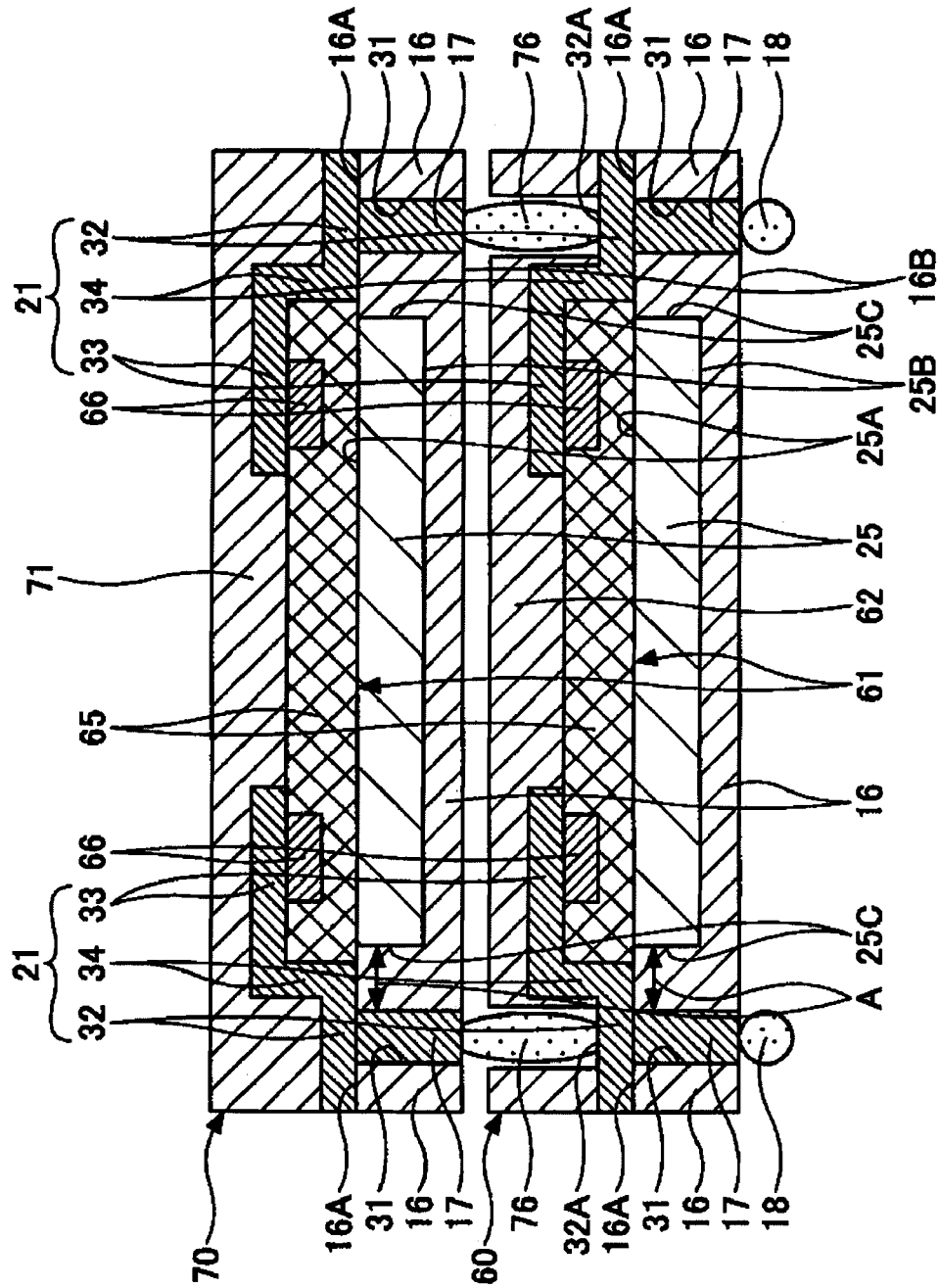
FIG. 29 is a sectional view showing a substrate stacked body in which substrates shown in FIG. 27 and FIG. 28 are stacked.

FIG. 29 is a sectional view showing a substrate stacked body in which substrates shown in FIG. 27 and FIG. 28 are stacked. In FIG. 29, components that are identical to those of the substrates 60, 70 shown in FIG. 27 and FIG. 28 are given the same symbols.

Referring to FIG. 29, the substrate stacked body 75 includes substrates 60, 70 and a conductive member 76. The substrate stacked body 75 is structured so that the substrate 70 is disposed on the substrate 60, and the pad 32 provided on the substrate 60 is electrically connected to the lower end of the penetration electrode 17 provided at the substrate 70 by the conductive member 76.

Thus, the substrate 70 is stacked on the substrate 60, and the substrates 60 and 70 may be electrically connected to each other. In addition, a substrate 60 not having a peripheral connection terminal 18 is disposed between the substrate 60 and substrate 70, which are provided on the substrate stacked body 75, and the substrates 60 and 70 disposed in the up and down direction of the substrate 60 not having the peripheral connection terminal 18 may be electrically connected to each other by means of the conductive member 76.

Embodiment 3

Figure 30:
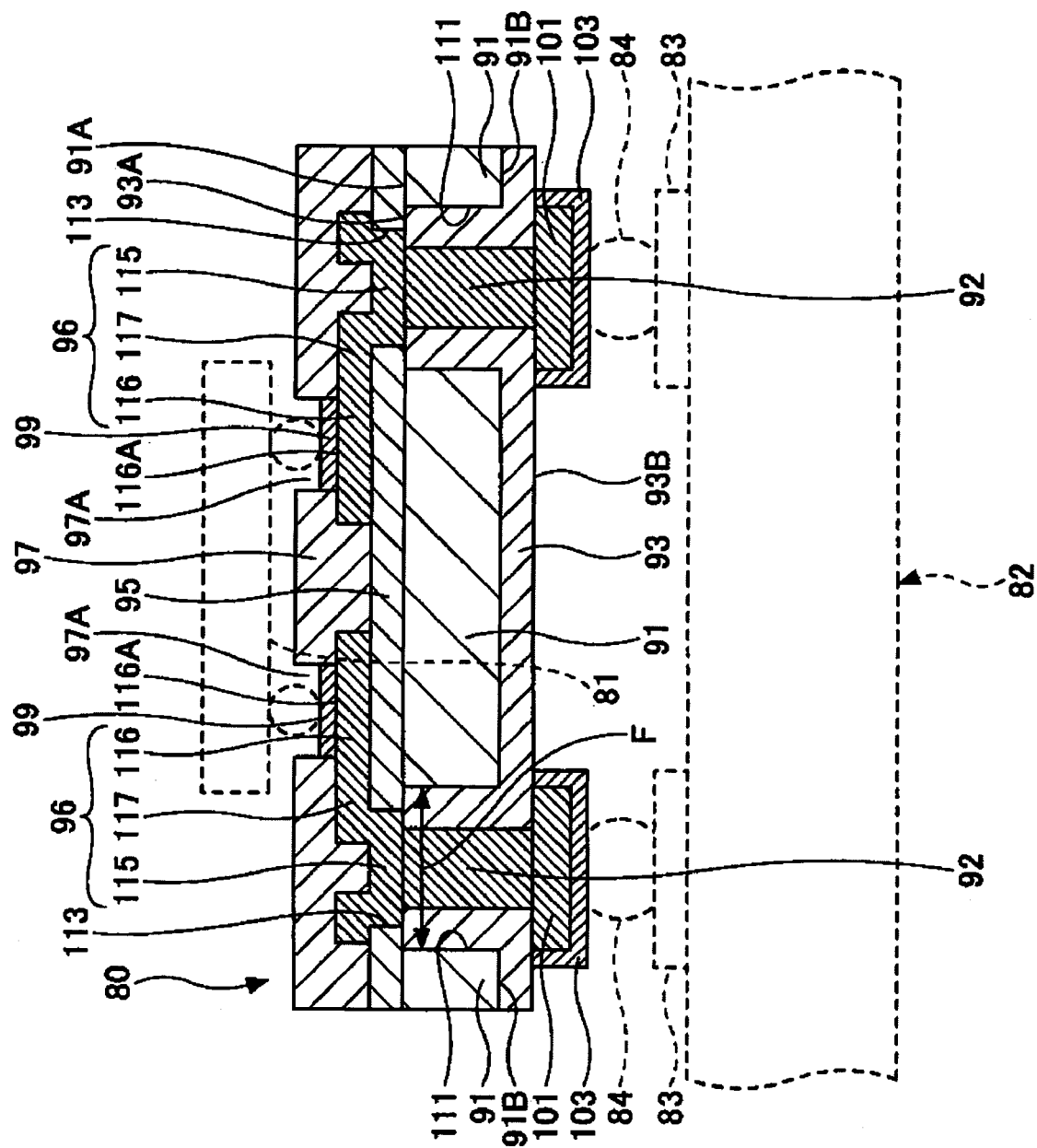
FIG. 30 is a sectional view showing a substrate according to Embodiment 3 of the present invention.

FIG. 30 is a sectional view of a substrate according to Embodiment 3 of the present invention.

Referring to FIG. 30, a substrate 80 according to Embodiment 3 includes a semiconductor substrate 91, a penetration electrode 92, an insulative member 93, an insulative film 95, a wiring pattern 96, solder resist 97, diffusion preventing films 99 and 103, and a peripheral connection pad 101.

The semiconductor substrate 91 is a thinned substrate, and has a penetration portion 111 having a plurality of penetration electrodes 92 accommodated therein, the plan view of which is frame-shaped. The penetration portion 111 accommodates at least two or more penetration electrodes 92, and simultaneously is a spacing in which a part of the insulative member 93 to insulate between the penetration electrodes 92 and the semiconductor substrate 91 is disposed. Where the diameter of the penetration electrode 92 is 80 μm, the width of the penetration portion 111 may be, for example, 120 μm. For example, a silicon substrate may be used as the semiconductor substrate 91. Where the silicon substrate is used as the semiconductor substrate 91, the thickness of the semiconductor substrate 91 may be, for example, 200 μm.

The penetration electrode 92 is provided at the penetration portion 111 in which the insulative member 93 is formed. The upper end side of the penetration electrode 92 is roughly flush with the surface 91A of the semiconductor substrate 91. The upper end of the penetration electrode 92 is connected to a pad 115 (one of the components of the wiring pattern 96) described later. The lower end of the penetration electrode 92 protrudes from the rear 91B of the semiconductor substrate 91. The lower end side of the penetration electrode 92 is roughly flush with the underside 93B of the insulative material 93. The lower end of the penetration electrode 92 is connected to a peripheral connection pad 101.

The insulative member 93 is filled up with the penetration portion 111 having the penetration electrode 92 disposed therein, and simultaneously is provided so as to cover the rear 91B of the semiconductor substrate 91. The upper surface 93A of the insulative member 93 at the portion provided in the penetration portion 111 is roughly flush with the surface 91A of the semiconductor substrate 91. In addition, the underside 93B of the insulative member 93 is roughly flush the lower end side of the penetration electrode 92. The insulative member 93 is a member to insulate the semiconductor substrate 91, the penetration electrode 92 and the peripheral connection pad 101. The thickness of the insulative member 93 at the portion provided on the rear 91B of the semiconductor substrate 91 may be, for example, 10 µm. For example, epoxy resin, polyamide resin, silicone resin, etc., which have a thermal hardening property, may be used as the material of the insulative member 93.

The insulative film 95 is provided at the surface 91A of the semiconductor substrate 91 so as to cover a part of the upper surface 93A of the insulative member 93. The insulative film 95 has an opening portion 113 to expose the upper end side of the penetration electrode 92 and the upper surface 93A of the insulative member 93 at the portion corresponding to an area where the pad 115 described later is formed. The diameter of the opening portion 113 may be, for example, 100 µm. Also, for example, a thermal oxidation film or an oxidation film formed by the CVD method etc., may be used as the insulative film 95. Where the thermal oxidation film or oxidation film is used as the insulative film 95, the thickness of the insulative film 95 may be, for example, 1.0 µm.

The wiring pattern 96 includes pads 115, 116 and wiring 117. The pad 115 is provided at the opening portion 113 formed on the insulative film 95. The pad 115 is connected to the upper end of the penetration electrode 92. The pad 115 is integral with the wiring 117. The pad 115 is electrically connected to the pad 116 via the wiring 117.

The pad 116 is provided on the insulative film 95. The pad 116 is integral with the wiring 117. The pad 116 is electrically connected to the pad 115 via the wiring 117. The pad 116 has a connection plane 116A on which a diffusion preventing film 99 is formed. The pad 116 is electrically connected to an electronic component 81 via the diffusion preventing film 99 formed on the connection plane 116A.

The wiring 117 is provided on the insulative film 95. The wiring 117 is integral with the pads 115 and 116 and electrically connects the pads 115 and 116 together.

For example, a Ti/Cu stacked film may be used as the wiring pattern 96 as described above. Where the Ti/Cu stacked film is used as the wiring pattern 96, the wiring pattern 96 may be formed by stacking a Ti layer (for example, 0.1 µm thick) and a Cu layer (for example, 0.1 µm thick) one after another by, for example, a sputtering method, and further stacking a Cu-plated layer (for example, 5.0 µm thick) formed by a plating method onto the Cu layer, and patterning the Ti/Cu stacked film.

The solder resist 97 is provided on the insulative film 95 so as to cover the wiring pattern 96 excluding the connection plane 116A. The solder resist 97 has an opening portion 97A to expose the connection plane 116A. The thickness of the solder resist 97 at the portion where it is disposed on the wiring 117 may be, for example, 10 µm.

The diffusion preventing film 99 is provided so as to cover the connection plane 116A. The diffusion preventing film 99 is a film connected to an electronic component 81 (for example, a semiconductor chip). For example, an Ni/Au stacked film in which an Ni layer (for example, 3.0 µm thick) and an Au layer (for example, 0.05 µm thick) are stacked on the connection plane 116A one after another may be used as the diffusion preventing film 99.

The peripheral connection pad 101 is disposed so as to extend from the lower end of the penetration electrode 92 to the underside 93B of the insulation member 93. The peripheral connection pad 101 is connected to the penetration electrode 92. The peripheral connection pad 101 is electrically connected to the wiring pattern 96 via the penetration electrode 92. The peripheral connection pad 101 is a pad that is electrically connected to the pad 83 provided on a mounted substrate 82 (for example, motherboard etc.) via the diffusion preventing film 103 and the peripheral connection terminal 84.

The diffusion preventing film 103 is provided so as to cover the side and the underside of the peripheral connection pad 101. The diffusion preventing film 103 is a film to which the peripheral connection terminal 84 (for example, a solder ball) is connected.

FIGS. 31 to 47 are views showing the processes of producing a substrate according to Embodiment 3 of the present invention. In FIGS. 31 to 47, components that are identical to those of the substrate 80 according to Embodiment 3 are given the same symbols.

Referring FIGS. 31 to 47, a description is given of the method for producing a substrate 80 according to Embodiment 3. First, in the process shown in FIG. 31, the insulative film 95 is formed on the surface 121A of a semiconductor substrate 121 having a plurality of substrate formed areas G in which the substrate 80 is formed. For example, a silicon wafer may be used as the semiconductor substrate 121. Where a silicon substrate is used as the semiconductor substrate 121, the thickness of the semiconductor substrate 121 may be, for example, 725 µm. The semiconductor substrate 121 is a substrate that is made into a plurality of semiconductor substrates 91 (refer to FIG. 30) by being thinned in the process shown in FIG. 32 described later, and thereafter, being cut along the cutting position H in the process shown in FIG. 47. For example, an oxidation film formed by the CVD method and a thermal oxidation film formed by the thermal oxidation method may be used as the insulative film 95. Where the oxidation film or the thermal oxidation film is used as the insulative film 95, the thickness of the insulative film 95 may be, for example, 1.0 µm.

Figure 31:
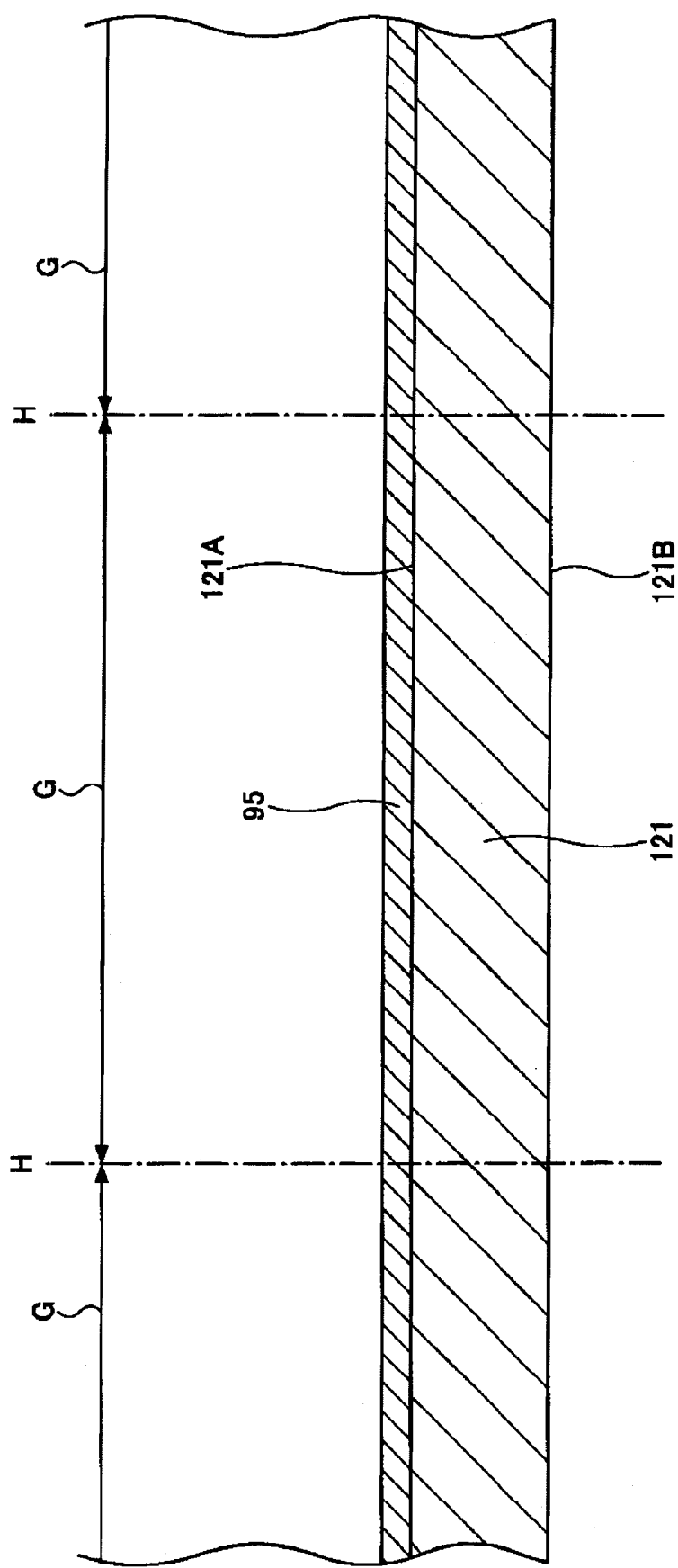
FIG. 31 is a view (Part 1) showing the process of producing a substrate according to Embodiment 3 of the present invention.
Figure 32:
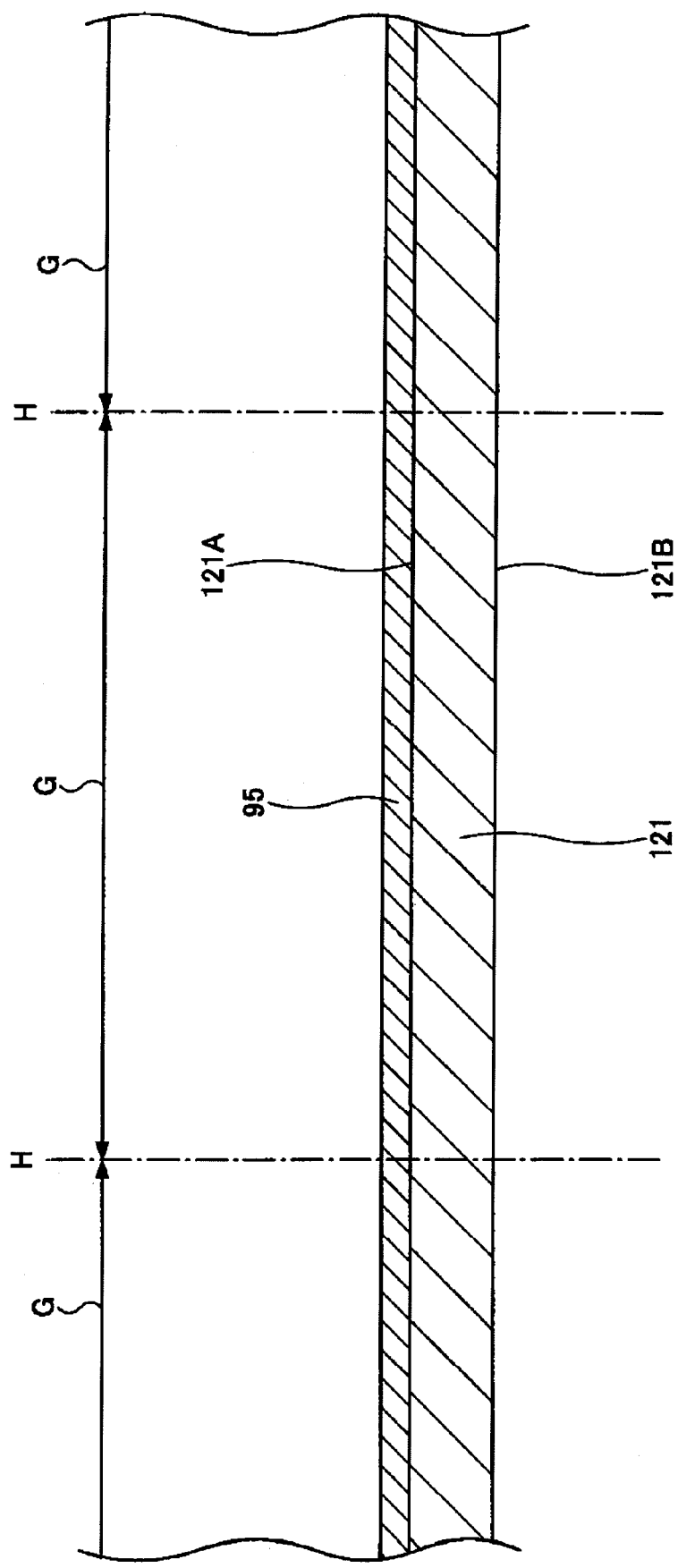
FIG. 32 is a view (Part 2) showing the process of producing a substrate according to Embodiment 3 of the present invention.

Next, in the process shown in FIG. 32, the semiconductor substrate 121 shown in FIG. 31 is thinned. In detail, the semiconductor substrate 121 is thinned by grinding and/or polishing the semiconductor substrate 121 from the rear 121B side of the semiconductor 121 shown in FIG. 31. After thinning, the thickness of the semiconductor substrate 121 may be, for example, 200 µm.

Figure 33:
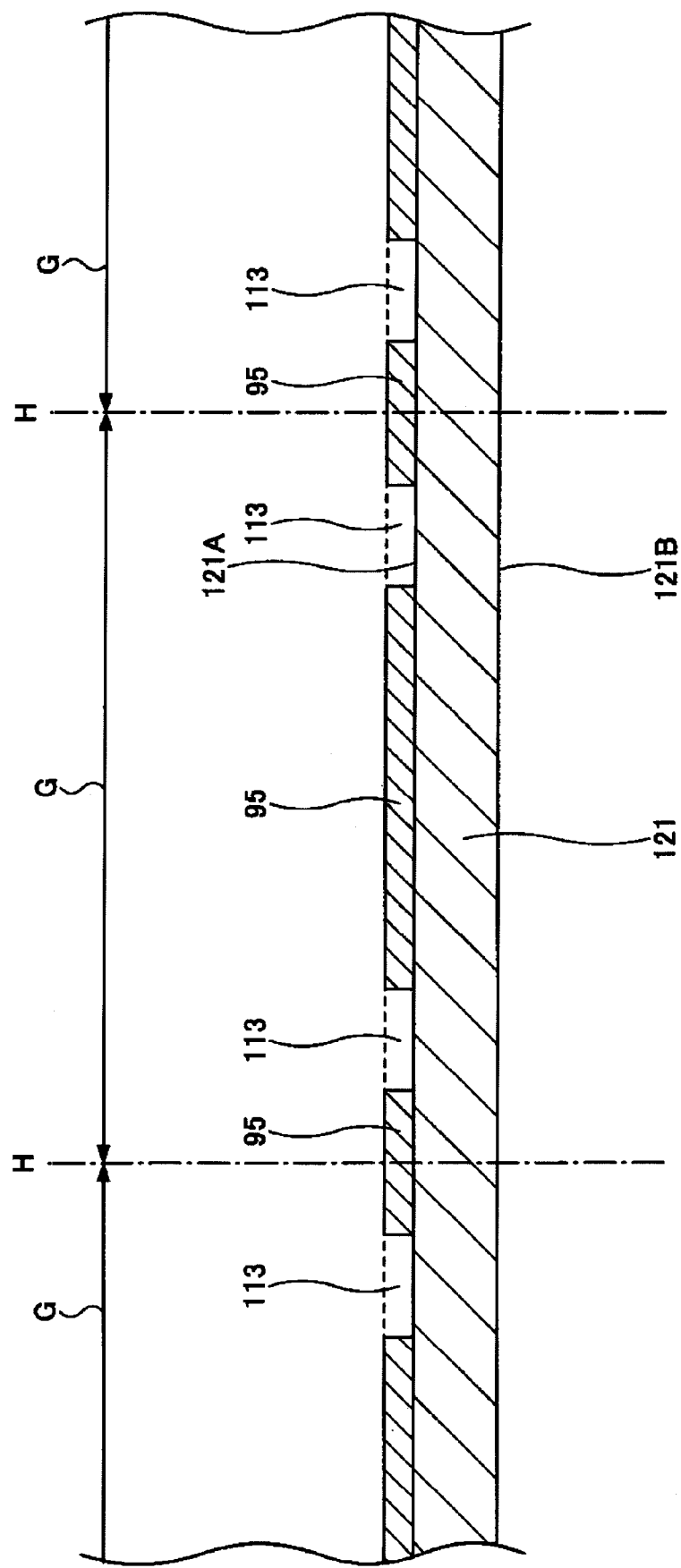
FIG. 33 is a view (Part 3) showing the process of producing a substrate according to Embodiment 3 of the present invention.

Next, in the process shown in FIG. 33, an opening portion 113 to expose the surface 121A of the semiconductor substrate 121 is formed in the insulative film 95. In detail, the opening portion 113 is formed by, for example, forming a resist film (not illustrated) having an opening portion to expose the insulative film 95 at the portion corresponding to the area, at which the opening portion 113 is formed, on the insulative film 95 and thereafter etching the insulative film 95 using the resist film as a mask until the surface 121A of the semiconductor substrate 121 is exposed. In addition, the resist film is removed after the opening portion 113 is formed.

Figure 34:
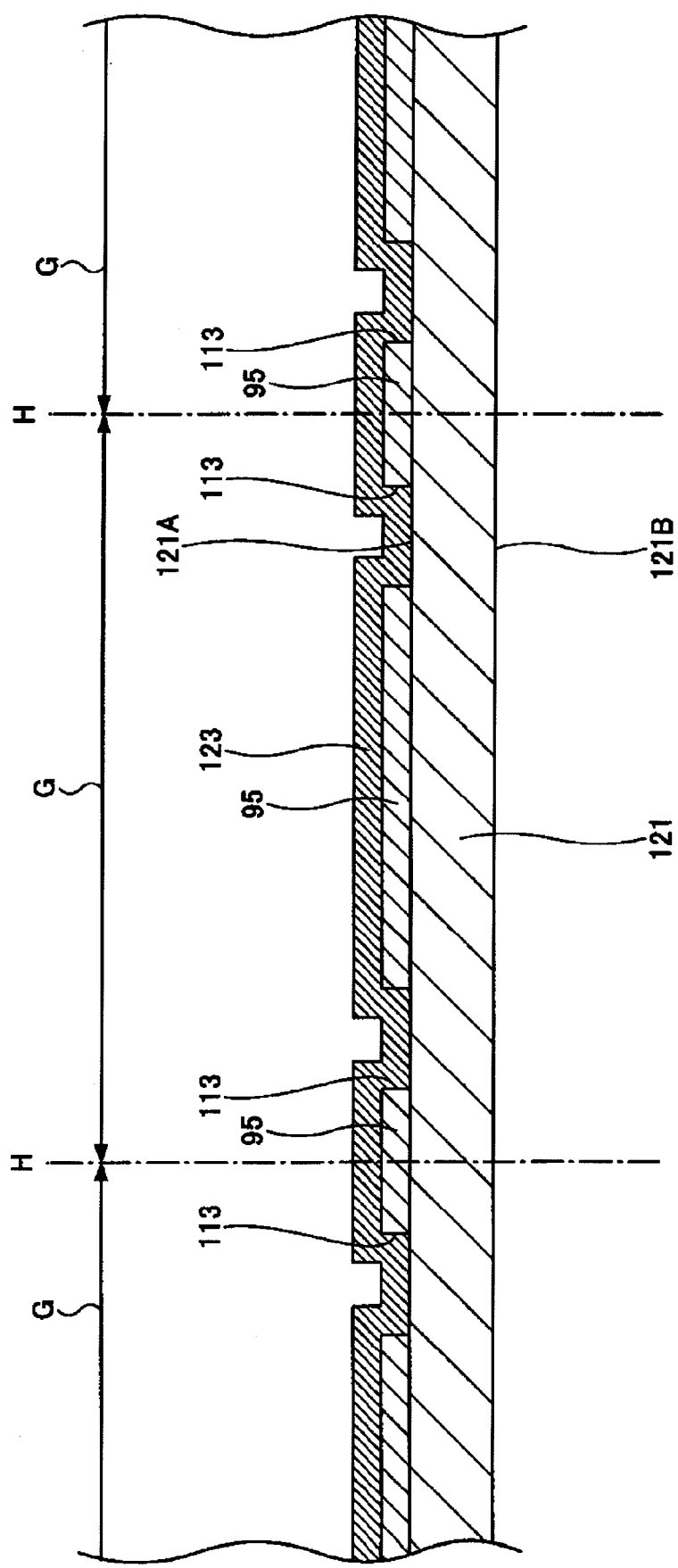
FIG. 34 is a view (Part 4) showing the process of producing a substrate according to Embodiment 3 of the present invention.

Next, in the process shown in FIG. 34, a metallic film 123 that becomes the matrix of the wiring pattern 96 is formed on the insulative film 95 so that it covers the side of the insulative film 95 at the portion corresponding to the side of the opening portion 113 and the surface 121A of the semiconductor substrate 121 at the portion exposed to the opening portion 113 (metallic film forming step).

For example, a Ti/Cu stacked film may be used as the metallic film 123. In this case, the metallic film 123 is formed by stacking a Ti layer (for example, 0.1 μm thick) and a Cu layer (for example, 0.1 μm thick) one after another so that it covers the upper surface of the structure shown in FIG. 33 by, for example, a sputtering method, and thereafter growing a Cu plated film (for example, 5.0 μm thick) on the Cu layer by precipitation by an electrolytic plating method for which the Cu layer is made into a power feeding layer.

Figure 35:
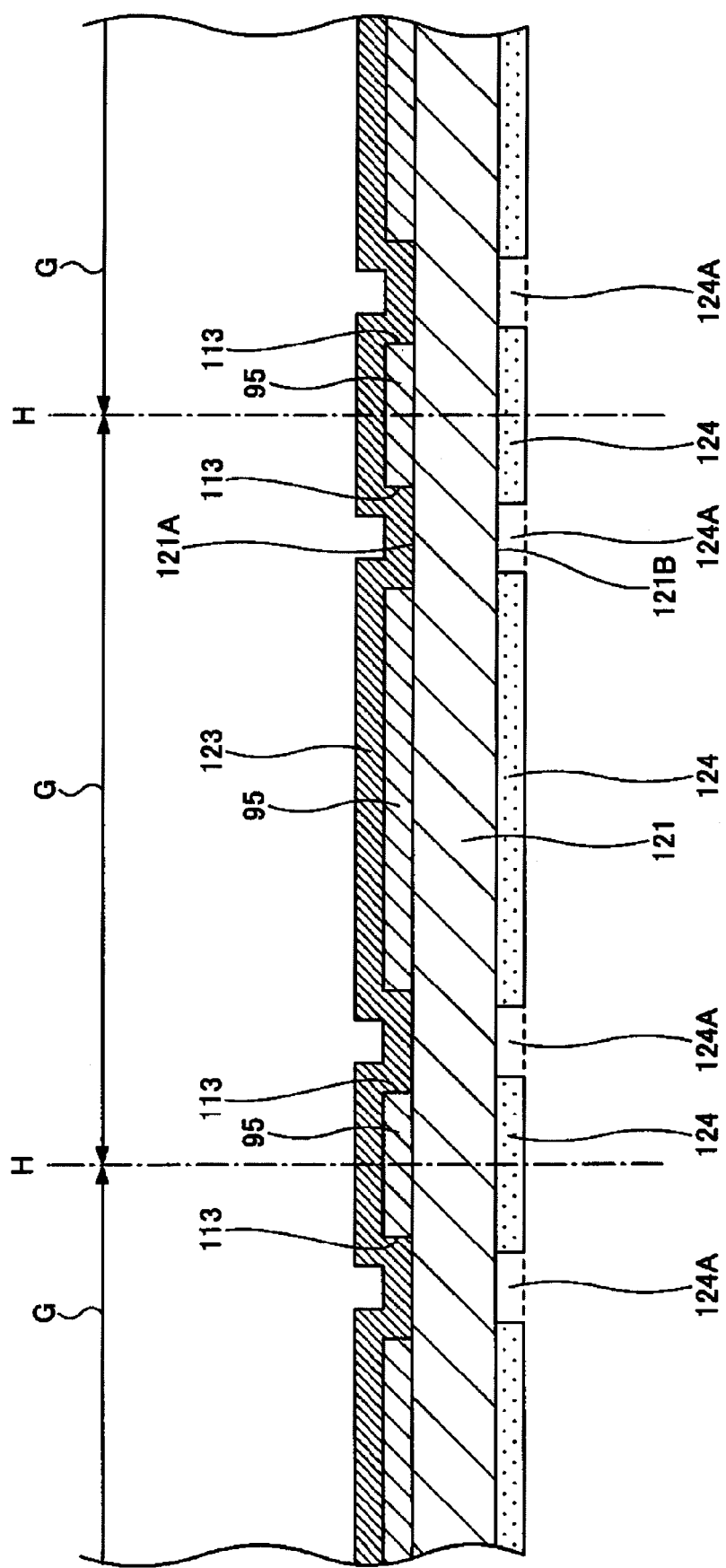
FIG. 35 is a view (Part 5) showing the process of producing a substrate according to Embodiment 3 of the present invention.

Next, in the process shown in FIG. 35, a resist film 124 having an opening portion 124A is formed on the rear 121B of the semiconductor substrate 121. At this time, the opening portion 124A is formed so as to expose the rear 121B of the semiconductor substrate 121 at the portion corresponding to the position where the penetration electrode 92 is formed. The thickness of the resist film 124 may be roughly equal to the thickness of the insulative member 93 (refer to FIG. 30) provided on the rear 91B of the semiconductor substrate 91. In detail, where the thickness of the insulative member 93 is 10 μm, the thickness of the resist film 124 may be, for example, 10 μm.

Figure 36:
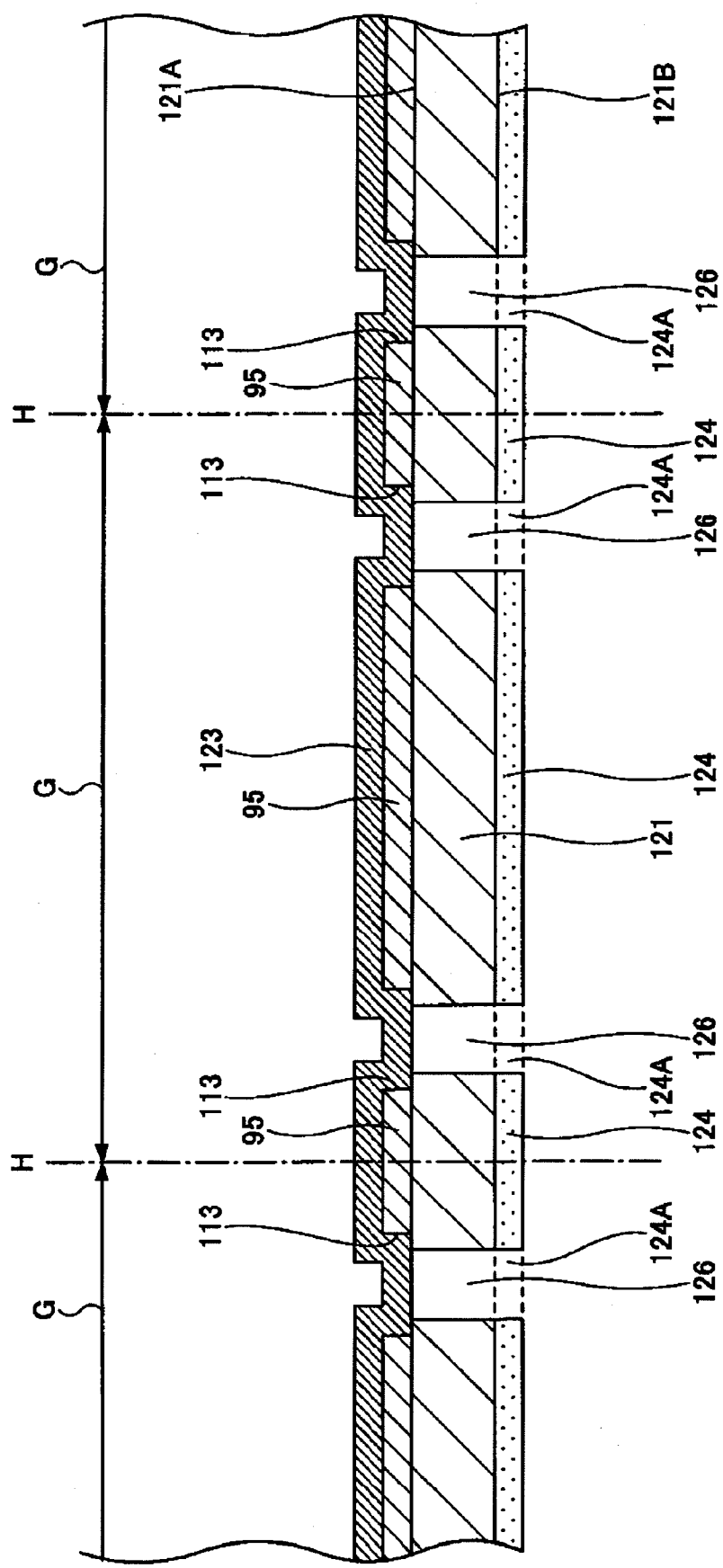
FIG. 36 is a view (Part 6) showing the process of producing a substrate according to Embodiment 3 of the present invention.

Next, in the process shown in FIG. 36, since the semiconductor substrate 121 is etched by anisotropic etching for which the resist film 124 is made into a mask, a through hole 126 is formed to expose the metallic film 123 (the metallic film 123 at the portion provided at the opening portion 113) at the portion that becomes the matrix of the pad 115 (through hole forming step). The diameter of the through hole 126 may be roughly equal to the diameter of the penetration electrode 92. Where the diameter of the penetration electrode 92 is 80 μm, the diameter of the through hole 126 may be, for example, 80 μm.

Figure 37:
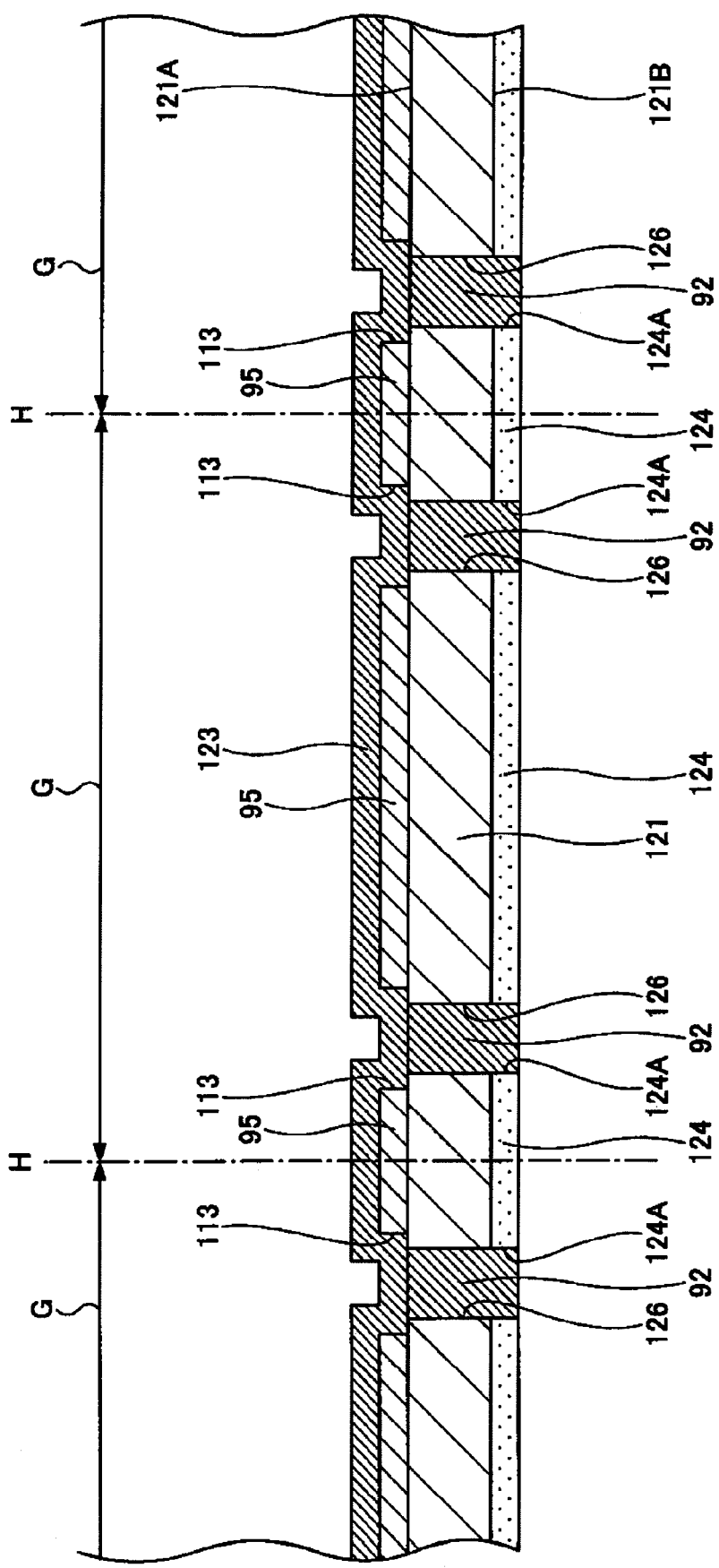
FIG. 37 is a view (Part 7) showing the process of producing a substrate according to Embodiment 3 of the present invention.

Next, in the process shown in FIG. 37, a plated film (for example, a Cu-plated film) to fill up the opening portion 124 and the through hole 126 is grown by precipitation on the underside of the metallic film 123 by an electrolytic plating method in which the metallic film 123 is made into a power feeding layer, wherein the penetration electrode 92 connected to the metallic film 123 at the portion that becomes the matrix of the pad 115 is formed (Penetration electrode forming step).

Thus, by forming the penetration electrode 92 before patterning the metallic film 123, it becomes possible to use the metallic film 123 as the power feeding layer when forming the penetration electrode 92 at a plurality of substrate-formed areas G, wherein it is possible to form penetration electrodes 92 in a plurality of through holes 126 provided in a plurality of substrate-formed areas G at the same time.

Also, since no insulative material intervenes between the metallic film 123 at the portion corresponding to the matrix of the pad 115 and the upper end of the penetration electrode 92, it becomes possible to prevent the resistance value between the penetration electrode 92 and the pad 115 from increasing. Therefore, the yield of the substrate 80 can be improved.

The diameter of the penetration electrode 92 may be, for example, 80 μm. Also, the protrusion amount of the penetration electrode 92 from the rear 121B of the semiconductor substrate 121 may be, for example, 10 μm.

Figure 38:
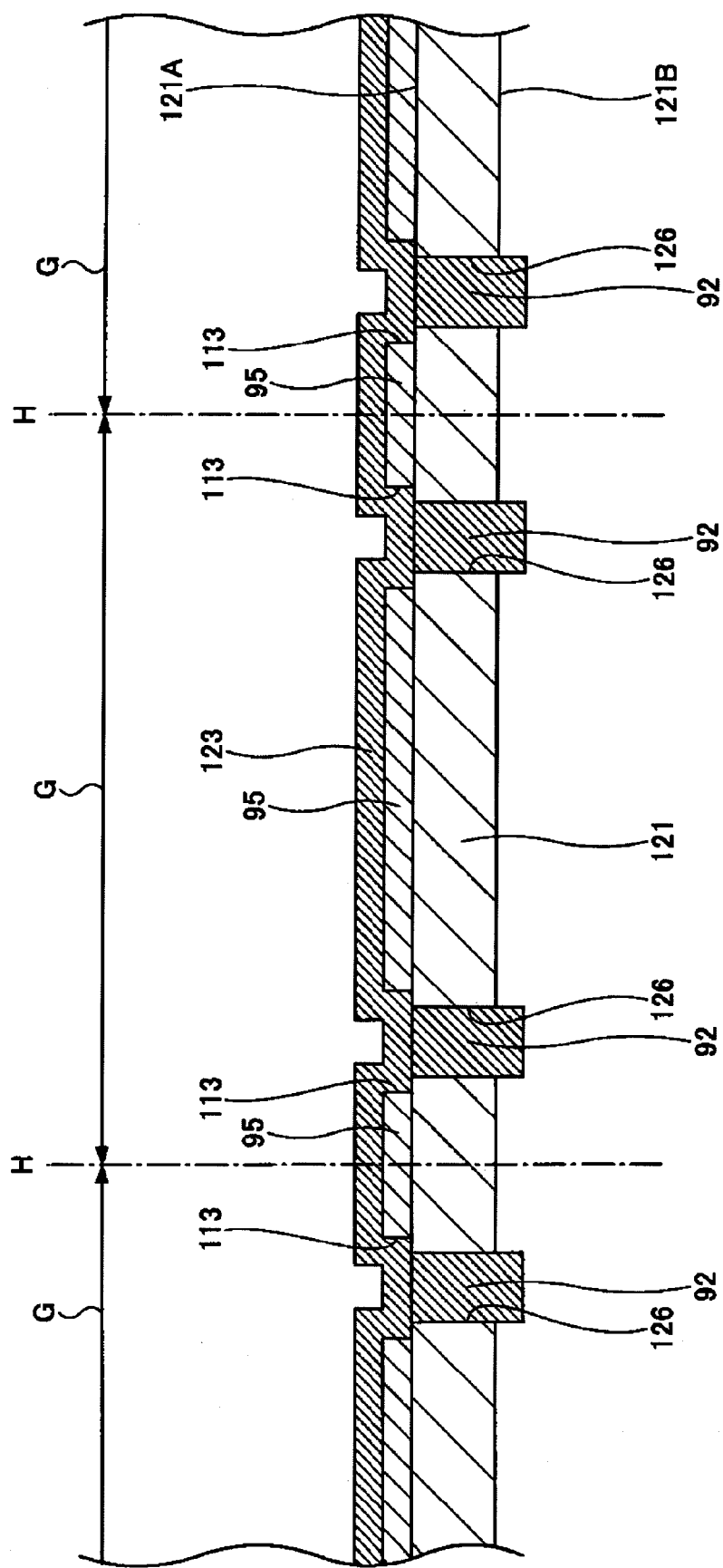
FIG. 38 is a view (Part 8) showing the process of producing a substrate according to Embodiment 3 of the present invention.

Next, in the process shown in FIG. 38, an unnecessary resist film 124 shown in FIG. 37 is removed. In the process shown in FIG. 39, a resist film 127 is formed on the rear 121B of the semiconductor 121, which has an opening portion 127A to expose the rear 121B of the semiconductor 121 at the portion corresponding to the areas where at least two or more penetration electrodes 92 are formed.

Figure 40:
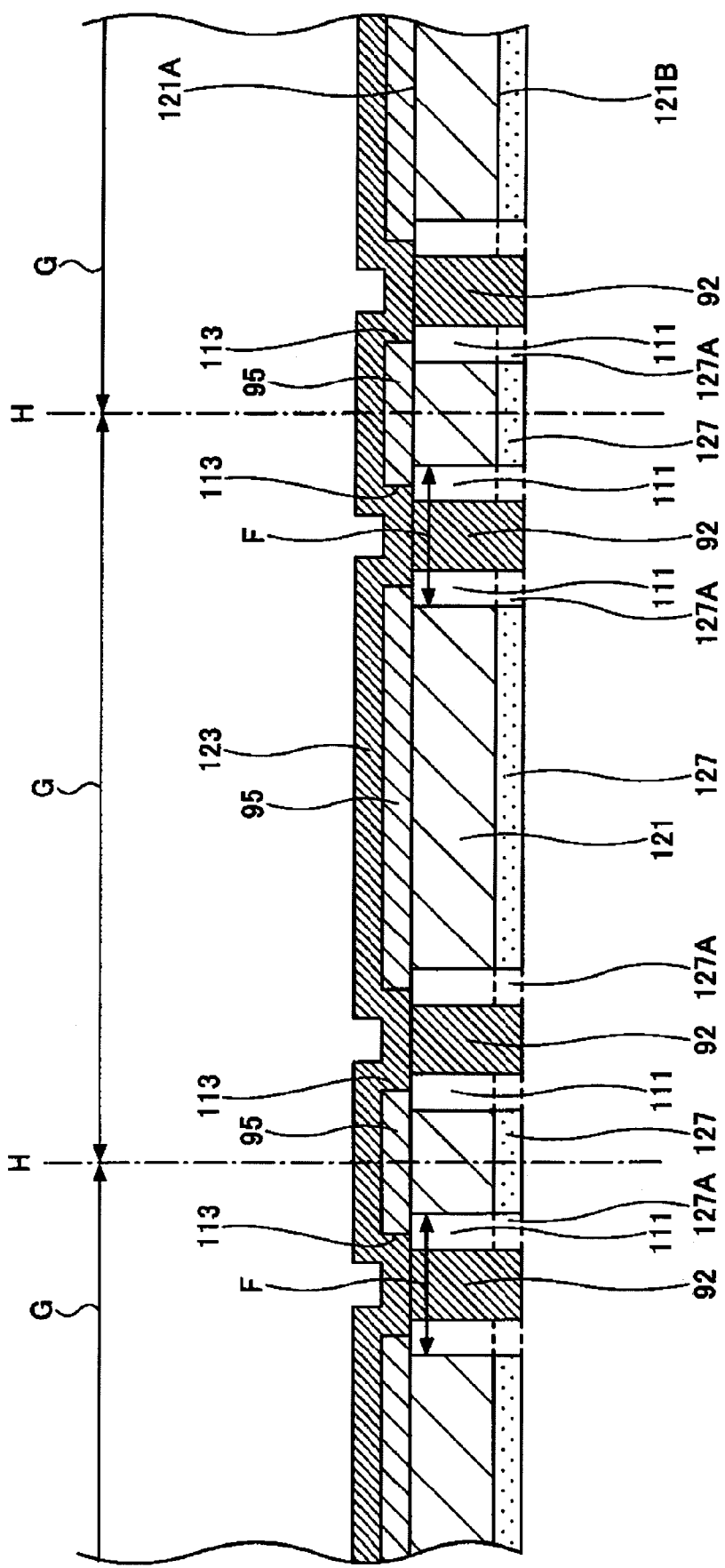
FIG. 40 is a view (Part 10) showing the process of producing a substrate according to Embodiment 3 of the present invention.

Next, in the process shown in FIG. 40, by etching the semiconductor substrate 121 using the resist film 127 as a mask, a part of the metallic film 123 at the portion that becomes the matrix of the pad 115 and a part of the insulative film 95 are exposed, and at the same time, a penetration portion 111 to expose the sides of at least two or more penetration electrodes 92 are formed (Penetration portion forming step).

Thus, by forming the penetration portion 111 so as to expose only the sides of at least two or more penetration electrodes 92, it becomes easier to fill up the penetration portion 111 with an insulative material (the matrix of the insulative member 93) in comparison with the case where the penetration portion is formed so as to expose only the side of a single penetration electrode 92. Therefore, it is possible to accurately fill up the penetration portion 111 with an insulative material (the matrix of the insulative member 93). Where the diameter of the penetration electrode is 80 μm, the width F of the penetration portion 111 may be, for example, 120 μm.

Figure 39:
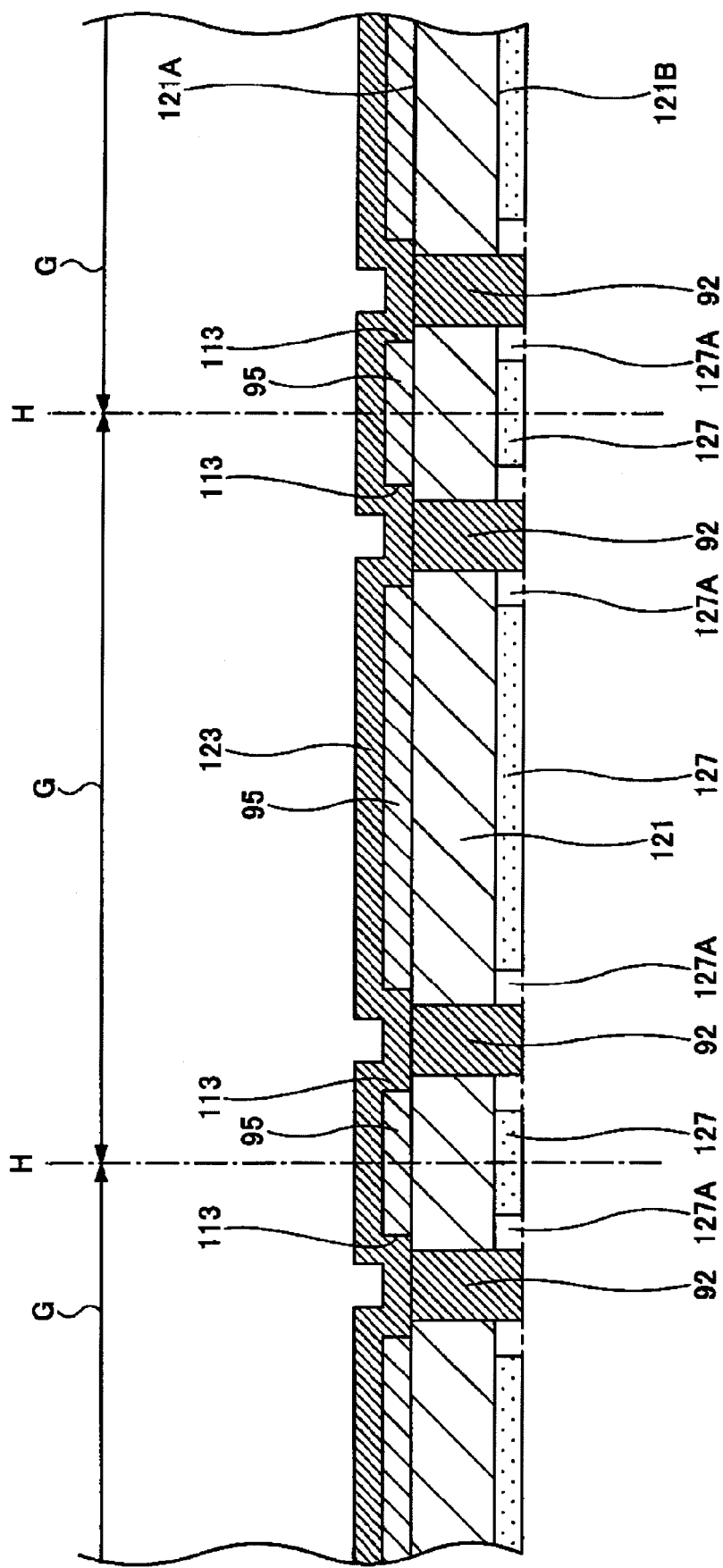
FIG. 39 is a view (Part 9) showing the process of producing a substrate according to Embodiment 3 of the present invention.

In addition, in the process shown in FIG. 39, a resist film (not illustrated) having a plurality of opening portions corresponding to an area where a single penetration electrode 92 is formed may be formed. And, in the process shown in FIG. 40, a plurality of penetration portions to expose the side of a single penetration electrode 92 may be provided using the resist film as a mask.

Figure 41:
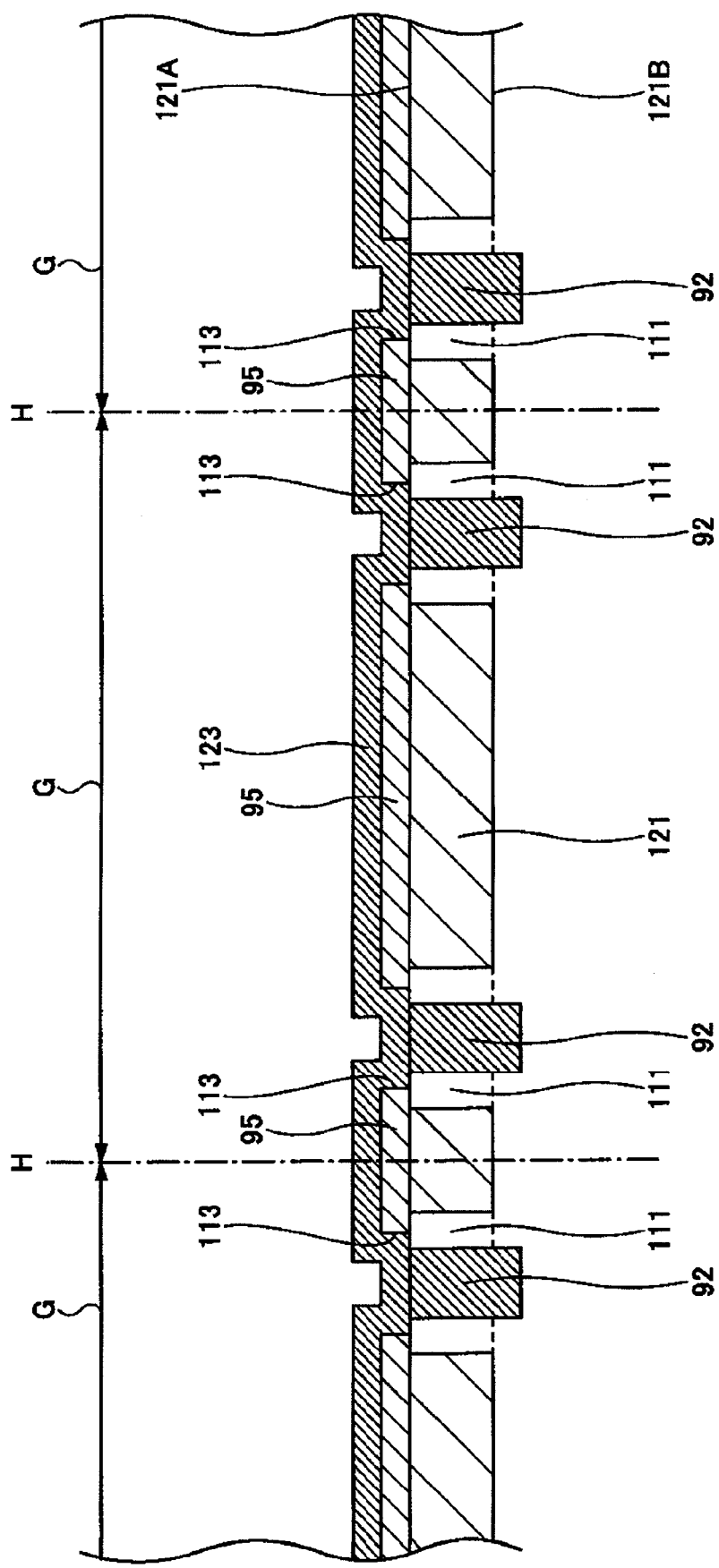
FIG. 41 is a view (Part 11) showing the process of producing a substrate according to Embodiment 3 of the present invention.

Next, in the process shown in FIG. 41, the resist film 127 shown in FIG. 40 is removed. Next, in the process shown in FIG. 42, for example, the penetration portion 111 is filled up by a printing method, and simultaneously an insulative material (the matrix of the insulative member 93) is disposed so as to cover the rear 121B of the semiconductor substrate 121 in a state where the lower end of the penetration electrode 92 is exposed (in detail, for example, the lower end side of the penetration electrode 92 is roughly flush with the underside 93B of the insulative member 93). After that, the insulative member 93 is formed by hardening the insulative material (insulative material forming step).

Thus, by forming the insulative member 93 which insulates between the penetration electrode 92 and the semiconductor substrate 121, there is no case where the thickness of the insulative member 93 disposed between the penetration electrode 92 and the semiconductor substrate 121 is thinned, wherein it is possible to sufficiently secure the insulative property between the penetration electrode 92 and the semiconductor substrate 121.

For example, thermal hardening type epoxy resin, polyamide resin, silicone resin, etc., may be used as the insulative material that becomes the matrix of the insulative member 93. Where the thermal hardening type epoxy resin is used as the insulative material that becomes the matrix of the insulative member 93, for example, the insulative material may be hardened by heating it so that the temperature becomes 150° C. or so.

Figure 42:
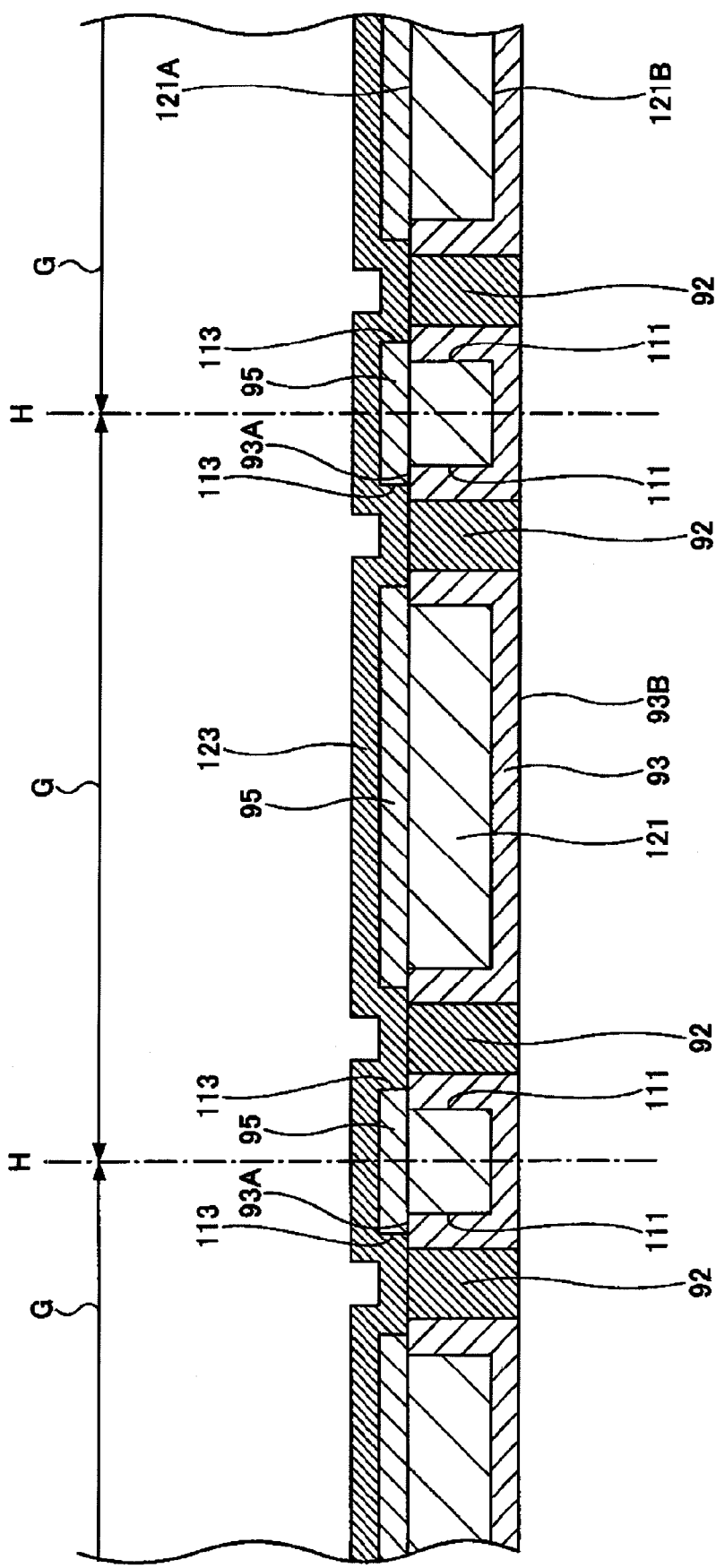
FIG. 42 is a view (Part 12) showing the process of producing a substrate according to Embodiment 3 of the present invention.
Figure 43:
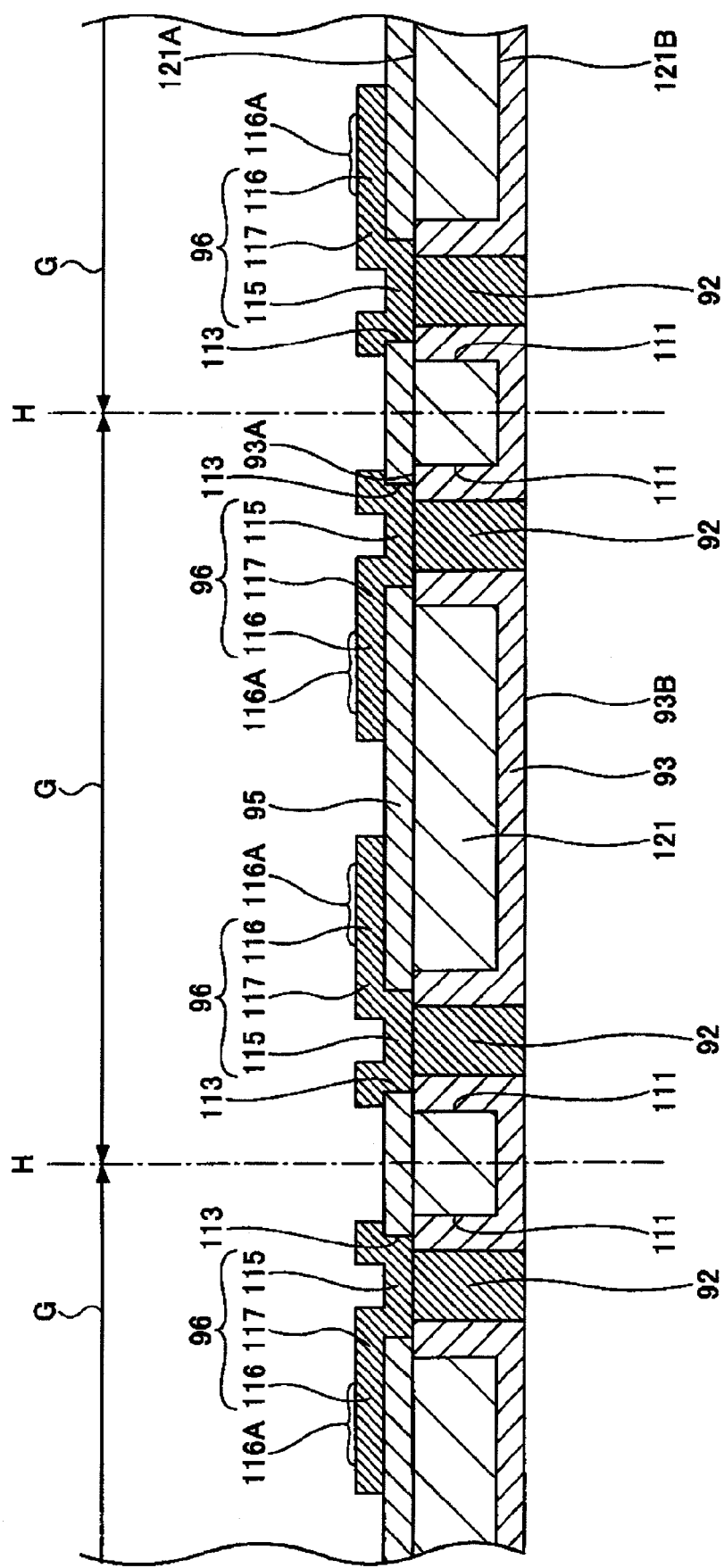
FIG. 43 is a view (Part 13) showing the process of producing a substrate according to Embodiment 3 of the present invention.

Next, in the process shown in FIG. 43, the wiring pattern 96 including pads 115, 116 and wiring 117 is formed by patterning the metallic film 123 shown in FIG. 42 (Pad forming step). In detail, for example, a resist film (not illustrated) is formed so as to cover only the metallic film 123 at the portion corresponding to the area where the wiring pattern 96 is formed. After that, the metallic film 123 is removed at the unnecessary portion by etching (for example, dry etching) using the resist film as a mask, wherein the wiring pattern 96 is formed. The resist film is removed after the wiring pattern 96 is formed.

Figure 44:
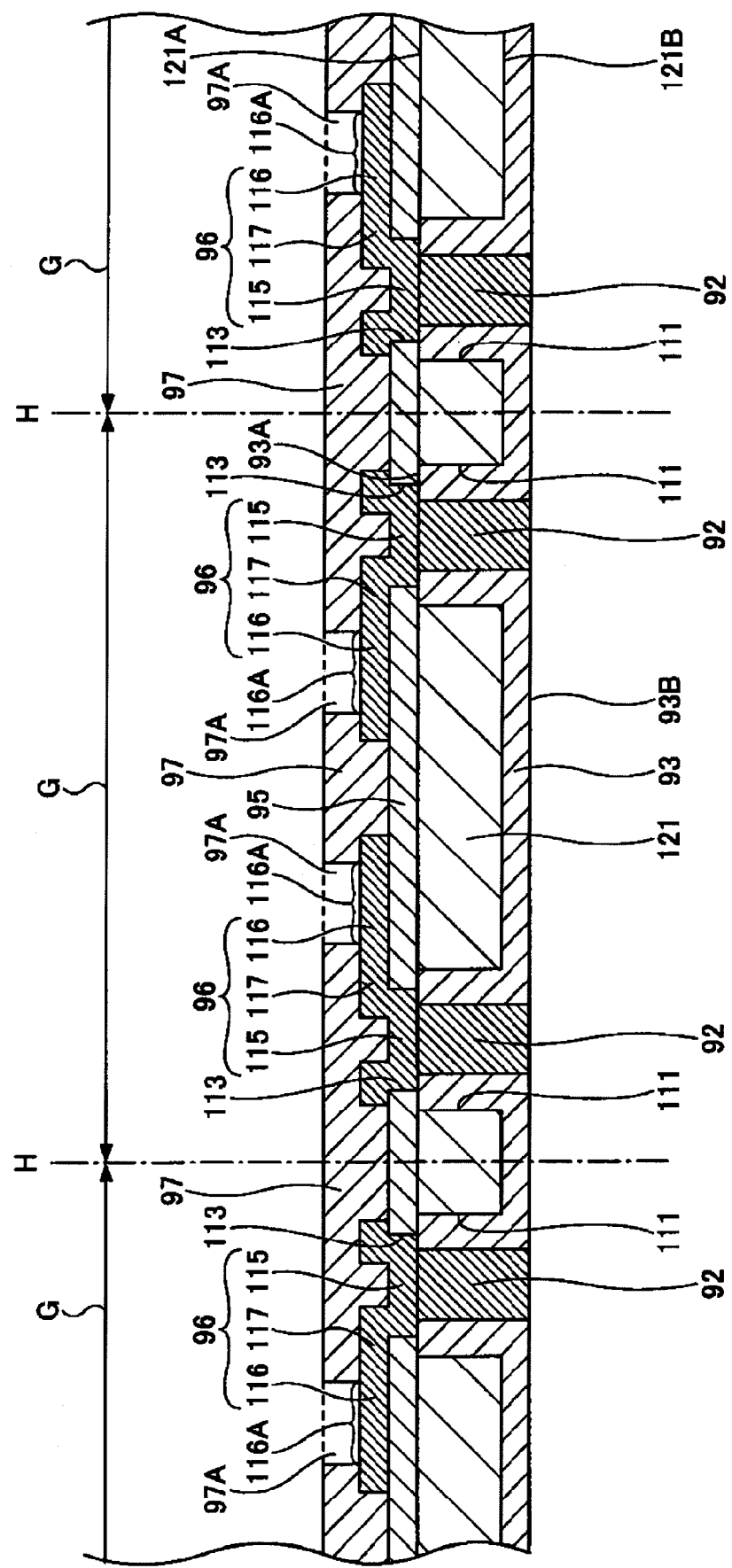
FIG. 44 is a view (Part 14) showing the process of producing a substrate according to Embodiment 3 of the present invention.

Next, in the process shown in FIG. 44, solder resist 97 having an opening portion 97A to expose the connection plane 116A of the pad 116 is formed on a structure shown in FIG. 43 by a publicly known method. The thickness of the solder resist 97 formed on the wiring 117 may be, for example, 10 μm.

Figure 45:
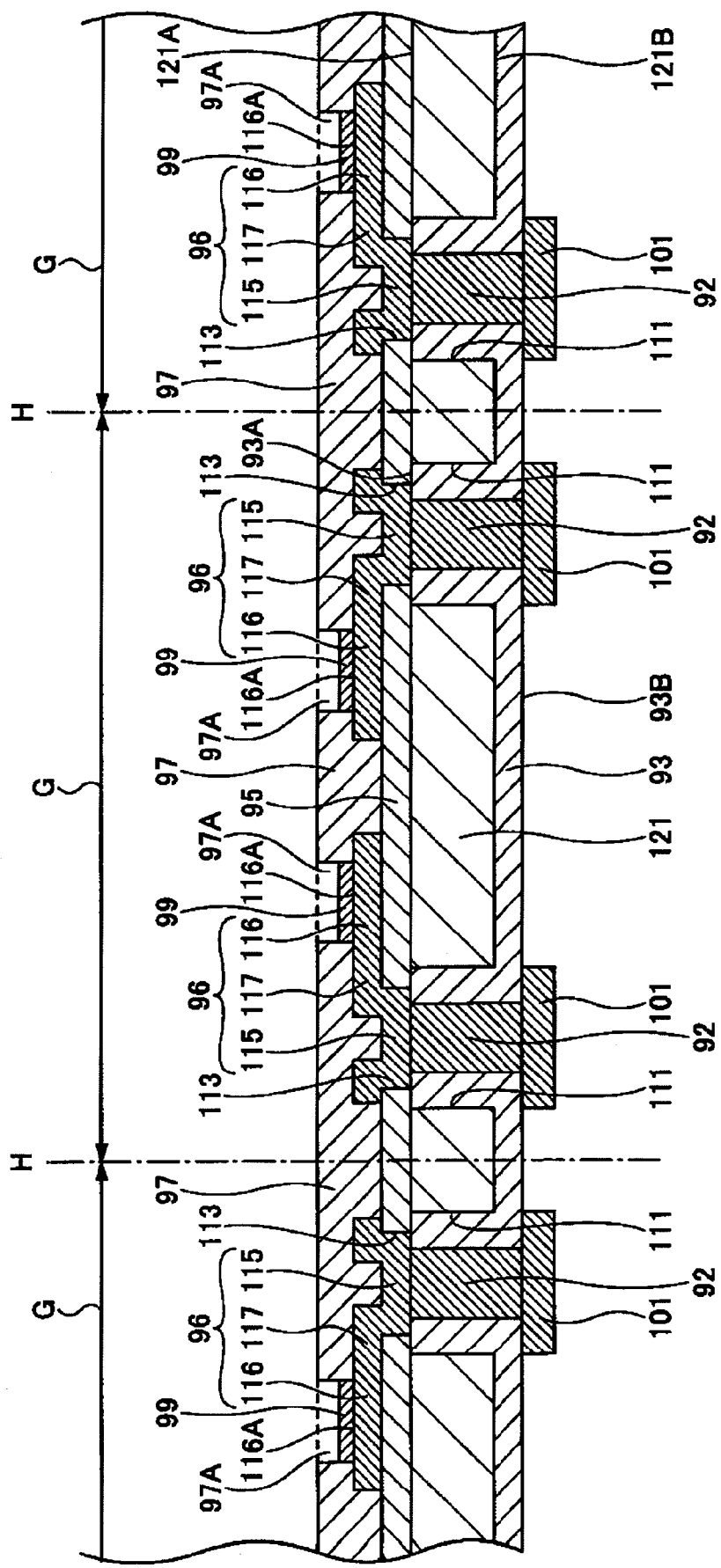
FIG. 45 is a view (Part 15) showing the process of producing a substrate according to Embodiment 3 of the present invention.

Next, in the process shown in FIG. 45, the peripheral connection pad 101 is formed on the lower end of the penetration electrode 92 and on the underside 93B of the insulative member 93. In detail, the peripheral connection pad 101 may be formed by, for example, a semi-active method. For example, Cu may be used as the material of the peripheral connection pad 101. The thickness of the peripheral connection pad 101 may be, for example, 5 μm.

Figure 46:
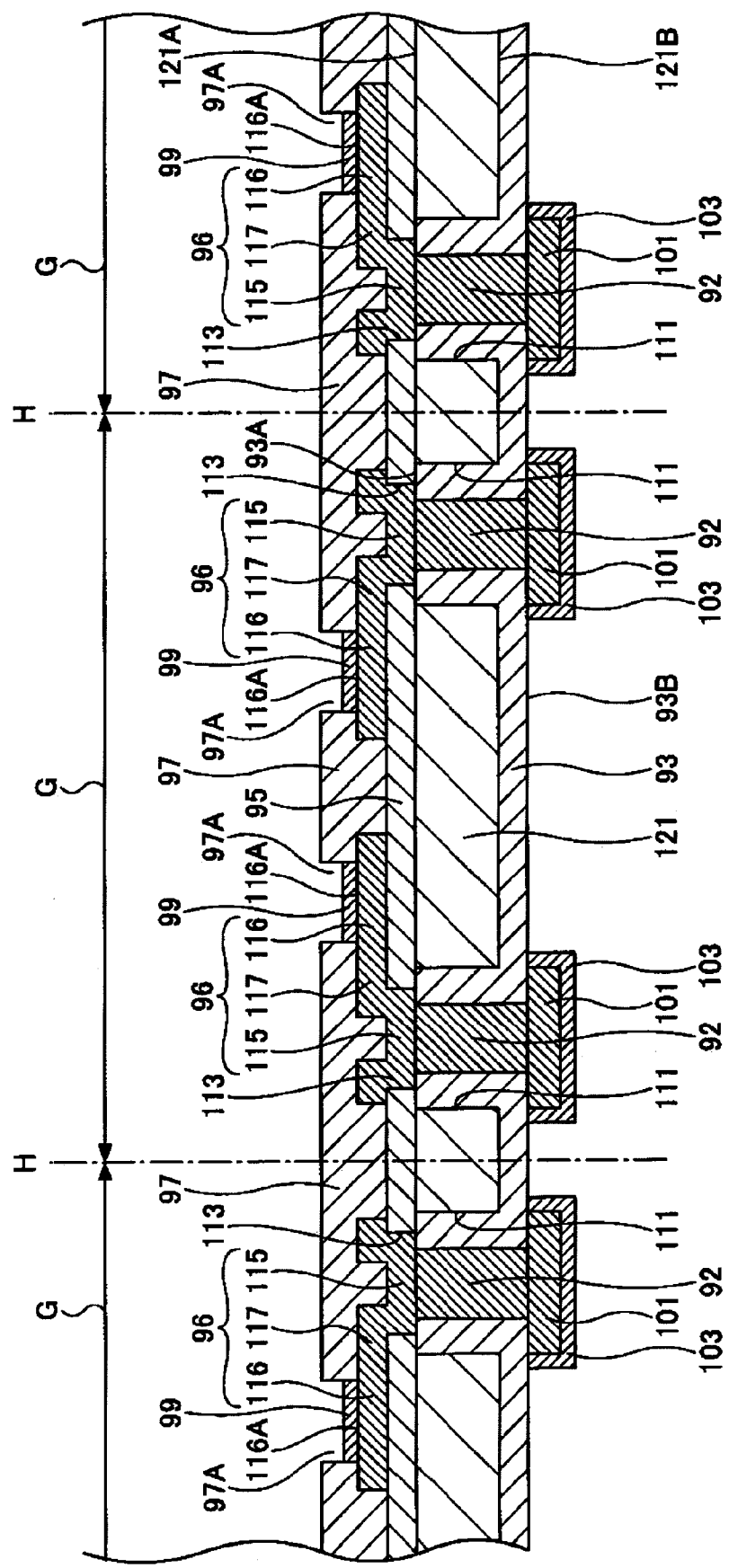
FIG. 46 is a view (Part 16) showing the process of producing a substrate according to Embodiment 3 of the present invention.

Next, in the process shown in FIG. 46, the diffusion preventing film 99 to cover the connection plane 116A of the pad 116 and the diffusion preventing film 103 to cover the peripheral connection pad 101 are formed at the same time by, for example, a non-electrolytic plating method. Therefore, a structure equivalent to the substrate 80 is formed at the semiconductor substrate 121 at the portion corresponding to the substrate-formed areas G. For example, an Ni/Au stacked film in which an Ni film (for example, 3.0 μm thick) and an Au film (for example, 0.05 μm thick) are stacked one after another may be used as the diffusion preventing films 99 and 103.

Figure 47:
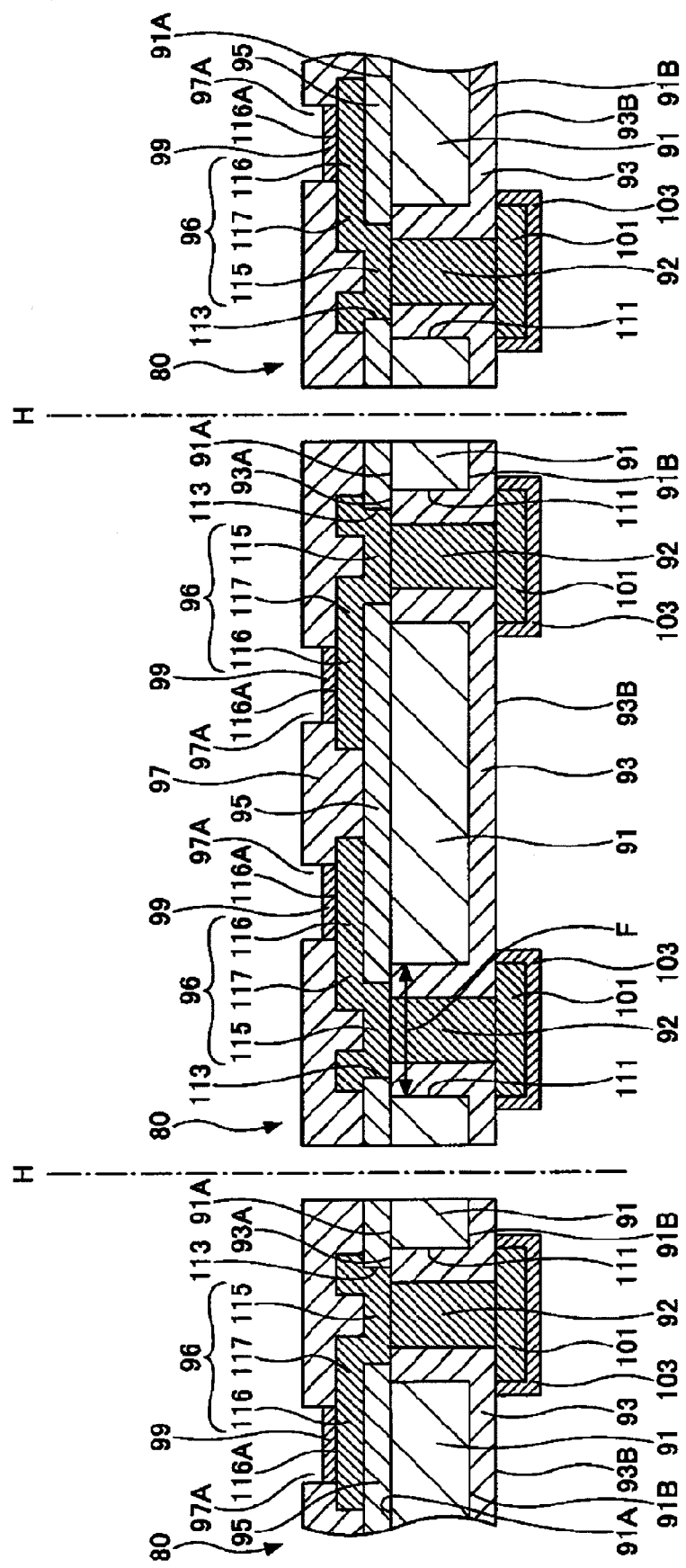
FIG. 47 is a view (Part 17) showing the process of producing a substrate according to Embodiment 3 of the present invention.

Subsequently, in the process shown in FIG. 47, a plurality of substrates 80 are individuated by cutting the structure, which is shown in FIG. 46, along the cutting position H.

With the method for producing substrates according to the present embodiment, the metallic film 123 that becomes the matrix of the pad 115 is formed on the semiconductor 121. After that, the through hole 126 is formed on the semiconductor substrate 121 facing the metallic film 43 at the portion corresponding to the area where the pad 115 is formed. Next, the penetration electrode 92 is formed in the through hole 126. Next, the penetration portion 111 that exposes the side of the penetration electrode 92 is formed at the semiconductor substrate 121. Thereafter, the insulative member 93 to fill up at least the penetration portion 111 is formed. After that, the pad 115 is formed by patterning the metallic film 123, wherein the insulative material does not intervene between the pad 115 and the penetration electrode 92 (that is, the resistance value between the penetration electrode 92 and the pad 152 does not increase), and simultaneously it becomes possible to sufficiently secure the thickness of the insulative material disposed between the side of the penetration portion 111 and the semiconductor substrate 121 (that is, a sufficient insulative property can be secured). Therefore, the yield of the substrate 80 can be improved.

As described above, a detailed description is given of preferred embodiments of the present invention. However, the present invention is not limited to such specified embodiments. The present invention may be subjected to various modifications and variations within the scope of the present invention, which is described in the Claims attached thereto.

The present invention is applicable to a method for producing substrates including a pad formed at one side of a semiconductor substrate and simultaneously insulated from the semiconductor substrate and a penetration electrode formed in the semiconductor substrate at the portion facing the pad, one end part of which is connected to the pad, and simultaneously is insulated from the semiconductor substrate.

What is claimed is:

1. A method for producing a substrate including a semiconductor substrate, a pad provided at one side of the semiconductor substrate and insulated from the semiconductor substrate, and a penetration electrode disposed so as to penetrate the semiconductor substrate at a portion facing the pad, one end part of which is connected to the pad and is insulated from the semiconductor substrate;

the method comprising the steps of:
forming a metallic film, which is a matrix of the pad, on the semiconductor substrate;
forming a through hole in the semiconductor substrate at a portion facing the metallic film at the portion corresponding to an area where the pad is formed;
forming a penetration electrode in the through hole;
forming a penetration portion, by which the side of the penetration electrode is exposed, in the semiconductor substrate;
forming an insulative material so as to fill up at least the penetration portion; and
forming the pad by patterning the metallic film after the step of forming the insulative material.

2. The method for producing a substrate according to claim 1, wherein
in the penetration electrode forming step, the penetration electrode is formed by an electrolytic plating method by which the metallic film is used as a power feeding layer.

3. The method for producing a substrate according to claim 1, wherein
the penetration electrodes are provided in a plurality, and
in the penetration portion forming step, the penetration portion is formed so that the sides of at least two or more penetration electrodes are exposed.

4. The method for producing a substrate according to claim 1, wherein
in the insulative material forming step, the penetration portion is filled up, and the insulative material is formed so as to cover the other side of the semiconductor substrate positioned at an opposite side of the one side.

5. The method for producing a substrate according to claim 1, wherein
in the insulative material forming step, the insulative material is formed by a printing method.

6. The method for producing a substrate according to claim 1, wherein
in the penetration electrode forming step, the penetration electrode is formed so that one end part of the penetration portion at a side not connected to the pad protrudes from the other side of the semiconductor substrate.

7. The method for producing a substrate according to claim 1, further comprising:
a step of forming a semiconductor device electrically connected to the pad at one side of the semiconductor substrate before the metallic film forming step.

* * * * *